(12) United States Patent  
Kim

(10) Patent No.: US 7,625,637 B2  
(45) Date of Patent: Dec. 1, 2009

(54) PRODUCTION OF METAL NANOPARTICLES FROM PRECURSORS HAVING LOW REDUCTION POTENTIALS

(75) Inventor: Hyungrak Kim, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 344 days.

(21) Appl. No.: 11/443,262

(22) Filed: May 31, 2006

(65) Prior Publication Data

US 2007/0290175 A1    Dec. 20, 2007

(51) Int. Cl.
*B32B 5/16* (2006.01)

(52) U.S. Cl. .................. 428/570; 428/403; 977/777

(58) Field of Classification Search .............. 428/403, 428/570; 977/777
See application file for complete search history.

(56) References Cited

U.S. PATENT DOCUMENTS

| | | | |
|---|---|---|---|
| 4,539,041 A | 9/1985 | Figlarz et al. | |
| 4,627,875 A | 12/1986 | Kobayashi et al. | |
| 5,176,744 A | 1/1993 | Muller | |
| 5,312,674 A | 5/1994 | Haertling et al. | |
| 5,329,293 A | 7/1994 | Liker | |
| 5,332,646 A | 7/1994 | Wright et al. | |
| 5,421,926 A | 6/1995 | Yukinobu et al. | |
| 5,604,673 A | 2/1997 | Washburn et al. | |
| 5,828,271 A | 10/1998 | Stitzer | |
| 5,846,615 A | 12/1998 | Sharma et al. | |
| 5,882,722 A | 3/1999 | Kydd | |
| 5,894,038 A | 4/1999 | Sharma et al. | |
| 5,997,044 A | 12/1999 | Behm et al. | |
| 6,019,926 A | 2/2000 | Southward et al. | |
| 6,036,889 A | 3/2000 | Kydd | |
| 6,103,868 A | 8/2000 | Heath et al. | |
| 6,238,734 B1 | 5/2001 | Senzaki et al. | |
| 6,344,272 B1 * | 2/2002 | Oldenburg et al. | 428/403 |
| 6,485,831 B1 * | 11/2002 | Fukushima et al. | 428/403 |
| 6,593,408 B1 * | 7/2003 | Takaki et al. | 524/414 |
| 6,599,631 B2 | 7/2003 | Kambe et al. | |
| 6,645,444 B2 * | 11/2003 | Goldstein | 423/1 |
| 6,649,138 B2 | 11/2003 | Adams et al. | |
| 6,710,366 B1 | 3/2004 | Lee et al. | |

(Continued)

FOREIGN PATENT DOCUMENTS

EP    1857575 A2  *  11/2007

OTHER PUBLICATIONS

Zhang et al, Platinum Monolayer Electrocatalysts for O Reduction: Pt Monlayer on Pd(111) and on Carbon-Supported Pd Nanoparticles, J. Phys. Chem. B. 2004, 108 (30) 10955-10964.*

(Continued)

*Primary Examiner*—H. (Holly) T Le

(57) ABSTRACT

Metallic nanoparticles and processes for forming metallic nanoparticles. In one aspect, the invention is to a process for forming nanoparticles comprising the step of heating a solution comprising a first metal precursor and a nucleating agent (e.g., nucleate nanoparticles or a nucleate precursor) in the presence of a base under conditions effective to form the nanoparticles. The first metal precursor preferably comprises a cationic metal species having a low reduction potential. The invention is also to a nanoparticle or plurality of nanoparticles, each nanoparticle comprising a core having a largest dimension less than about 10 nm; and a metal layer substantially surrounding the core and having a largest dimension less than about 200 nm.

12 Claims, 3 Drawing Sheets

U.S. PATENT DOCUMENTS

| | | | |
|---|---|---|---|
| 6,713,389 B2 | 3/2004 | Speakman | |
| 6,773,823 B2 * | 8/2004 | O'Connor et al. | 428/548 |
| 6,797,380 B2 * | 9/2004 | Bonitatebus, Jr. et al. | 428/842.2 |
| 7,005,669 B1 * | 2/2006 | Lee | 257/21 |
| 7,135,055 B2 * | 11/2006 | Mirkin et al. | 75/343 |
| 7,238,472 B2 * | 7/2007 | Mirkin et al. | 435/6 |
| 7,261,940 B2 * | 8/2007 | Klimov et al. | 428/403 |
| 7,288,325 B2 * | 10/2007 | Eklund et al. | 428/570 |
| 2003/0008145 A1 * | 1/2003 | Goldstein | 428/403 |
| 2004/0058457 A1 | 3/2004 | Huang et al. | |
| 2004/0124504 A1 | 7/2004 | Hsu | |
| 2004/0182533 A1 | 9/2004 | Blum et al. | |
| 2004/0231462 A1 | 11/2004 | Shiraishi et al. | |
| 2006/0083694 A1 | 4/2006 | Kodas et al. | |
| 2006/0134505 A1 * | 6/2006 | Wang et al. | 429/40 |
| 2006/0159603 A1 | 7/2006 | Vanheusden et al. | |
| 2006/0189113 A1 | 8/2006 | Vanheusden et al. | |

OTHER PUBLICATIONS

Viau, G. et al., Nucleation and Growth of Bimetallic CoNi and FeNi Monodisperse Particles Prepared in Polyols, Solid State Ionics, vol. 84, No. 3, pp. 259-270; Apr. 1996, North Holland Publishing Company, Amsterdam, NL.

Zheng, H-G et al., Preparation of Nickel Nanopowders in Ethanol-water System (EWS), Materials Research Bulletin, vol. 36, No. 5-6, pp. 947-952, Mar. 2001, Elsevier, Kindlington, GB.

International Search Report and Written Opinion issued for the corresponding International Patent Application No. PCT/US2007/070153, 2007.

Fievet, F., et al., "Homogeneous and Heterogeneous Nucleations in the Polyol Process for the Preparation of Micron and Submicron Size Metal Particles", *Solid State Ionics*, 32/33, pp. 198-205 (1989).

Hou, Yanglong, et al., "Monodisperse Nickel Nanoparticles Prepared from a Monosurfactant System and Their Magnetic Properties", *Journal of Materials Chemistry*, 13, pp. 1510-1512 (2003).

Park, Jongnam, et al., "Monodisperse Nanoparticles of Ni and NiO: Synthesis Characterization, Self-Assembled Superlattices, and Catalytic Applications in the Suzuki Coupling Reaction", *Advanced Materials*, 17, No. 4, pp. 429-434 (2005).

Silvert, P.-Y., et al., "Preparation of Colloidal Silver Dispersions By The Polyol Process Part 1—Synthesis and Characterization", *Journal of Materials Chemistry*, 6(4), pp. 573-577 (1996).

Silvert, P.-Y., et al., "Preparation of Colloidal Silver Dispersions By The Polyol Process Part 2—Mechanism of Particle Formation", *Journal of Materials Chemistry*, 7(2), pp. 293-299 (1997).

Toneguzzo, P., et al., "Monodisperse Ferromagnetic Particles for Microwave Applications", *Advanced Materials*, 10, No. 13, pp. 1032-1035 (1998).

Vanheusden, Karel, et al., "Production of Metal Nanoparticles" U.S. Appl. No. 11/331,230, filed Jan. 13, 2006.

* cited by examiner

PRODUCTION OF METAL NANOPARTICLES FROM PRECURSORS HAVING LOW REDUCTION POTENTIALS

FIELD OF THE INVENTION

The present invention relates to nanoparticles and to processes for producing nanoparticles. In particular, the invention relates to processes that afford the ability to form metal nanoparticles from metal precursors comprising cationic metal species having low reduction potentials and to metal nanoparticles formed by such processes.

BACKGROUND OF THE INVENTION

The production of metal particles by the polyol process is known from, e.g., U.S. Pat. No. 4,539,041 to Figlarz et al., the entire disclosure of which is expressly incorporated by reference herein. In the polyol process, a metal precursor is reduced at an elevated temperature by a polyol to afford the corresponding metal in the form of particles (usually in the micron and nanometer size range). A number of metal precursors and in particular, a number of transition metal precursors can be converted to metal particles by this process. In a typical procedures a solid metal precursor is dissolved in a polyol and the solution is heated until the reduction of the metal precursor is substantially complete. Thereafter, the formed particles are isolated by separating them from the liquid phase, e.g., by centrifugation.

A modification of this method is described in, e.g., P.-Y. Silvert et al., "Preparation of colloidal silver dispersions by the polyol process" Part 1—Synthesis and characterization, J. Mater. Chem., 1996, 6(4), 573-577; and Part 2—Mechanism of particle formation, J. Mater. Chem., 1997, 7(2), 293-299. According to the Silvert et al. articles, the entire disclosures of which are expressly incorporated by reference herein, the polyol process is carried out in the presence of a polymer, i.e., polyvinylpyrrolidone (PVP). In particular, the PVP is dissolved in the polyol and helps to control the size and the dispersity of the metal particles. In a typical experiment, about 10 g of PVP was dissolved at room temperature in 75 ml of ethylene glycol and 2.4 mmole (400 mg) of silver nitrate was added to this solution. The resultant suspension was stirred at room temperature until the silver nitrate had dissolved completely, whereafter the system was heated to 120° C. and the reaction was conducted at this temperature for several hours. After cooling and dilution with water, the reaction mixture afforded silver particles having a mean particle size of 21 nm with a standard deviation of 16%.

While the reported results are desirable for some metal precursors, other metal precursors are not readily reducible to form metallic particles. For example, $Ni^{2+}$ has a reduction potential of about −0.25 V. It is difficult to form metallic nanoparticles from metal precursors having a reduction potential less than about 0.6 V. In addition, metal nanoparticles, such as Co, Ni, and Cu-containing metal nanoparticles, formed from metal precursors having low standard reduction potentials, are often easily oxidized during a production process.

Thus, the need exists for processes for forming nanoparticles without oxidation from metal precursors having a low reduction potential, e.g., less than about 0.60 V, less than about 0.40 V, less than about 0.20 V or less than about 0.0 V. Nanoparticles formed from such processes would be useful in a variety of applications. For example, electronic inks comprising such nanoparticles could be employed in the fabrication of electrically conductive features for use in electronics, displays, and other applications.

SUMMARY OF THE INVENTION

The present invention provides an improved process for forming metallic nanoparticles from metal precursors having a reduction potential less than about 0.6 V. In one embodiment, the invention is to a nanoparticle, comprising: a core having a largest dimension less than about 10 nm; and a metal layer substantially surrounding the core and having a largest dimension less than about 200 nm. The invention is also to powders comprising or consisting essentially of a plurality of these nanoparticles, and to inks comprising a plurality of these nanoparticles and a liquid vehicle.

The metal layer optionally comprises a metal having a cationic form with a reduction potential less than about 0.6 V, e.g., less than about 0.3 V, or less than about less than about 0 V. The metal layer optionally comprises a metal selected from the group consisting of: nickel, copper, cobalt, iron, and chromium. Optionally, the metal layer has a surface and the nanoparticle further comprises a dispersing agent, e.g., polyvinyl pyrrolidone (PVP), disposed on at least a portion of the surface of the metal layer. The metal layer optionally comprises an alloy.

The core optionally comprises either a metal selected from the group consisting of silver, copper, platinum, palladium and gold or an oxide selected from the group consisting of silica, titania, alumina and zirconia or metal alloy selected from Ag/Pt, Ag/Pd, Ag/Au.

Optionally, the nanoparticle is part of an aggregate of nanoparticles, the aggregate having a particle size of from about 1 μm to about 5 μm. Preferably, the nanoparticles are spherical or quasi-spherical.

In a second embodiment, the invention is to a process for forming nanoparticles, comprising the step of heating a solution comprising a first metal precursor and a nucleating agent in the presence of a base under conditions effective to form the nanoparticles. The solution optionally further comprises a solvent selected from the group consisting of a polyol, ethylene glycol, propylene glycol, 1,3-propanediol, and combinations thereof.

In a third embodiment, the invention is to a process for forming nanoparticles, the process comprising the steps of: (a) providing a solution comprising a first metal precursor to a first metal, a base, a and a solvent; (b) heating the solution; (c) adding a nucleating agent to the solution; and (d) adding a dispersing agent to the solution; wherein the process forms nanoparticles comprising the first metal. Step (c) may occur before or during step (b). Similarly, step (d) optionally occurs during or after step (b). The solvent optionally is selected from the group consisting of a polyol, ethylene glycol, propylene glycol, 1,3-propanediol, and combinations thereof.

In the processes of the invention, the first metal precursor optionally comprises a cationic metal species having a reduction potential less than about 0.6 V, less than about 0.3 V, or less than about 0 V. Optionally, the first metal precursor comprises a metal selected from the group consisting of: nickel, copper, cobalt, iron, and chromium. For example, the first metal precursor optionally is selected from the group consisting of nickel nitrate, nickel acetate, copper nitrate, copper acetate, cobalt nitrate, cobalt acetate, iron nitrate and iron acetate. Optionally, the first metal precursor comprises a first metal, wherein the solution further comprises a second metal precursor to a second metal, and wherein the nanoparticles comprise an alloy of the first metal and the second metal. The base optionally is selected from the group consisting of sodium hydroxide, potassium hydroxide, ammonium hydroxide, and an organic base.

The nucleating agent optionally comprises a nucleate nanoparticle comprising either a metal selected from the group consisting of silver, copper, platinum, palladium and gold or an oxide selected from the group consisting of: silica, titania, alumina and zirconia or a metal alloy selected from the group consisting of: Ag/Pt, Ag/Pd, and Ag/Au. The nucleating agent optionally comprises a nucleate precursor having a reduction potential that is greater than the reduction potential of the first metal precursor. For example, the nucleating agent optionally comprises a nucleate precursor having a reduction potential that is at least 0.2 V greater than, e.g., at least 0.4 V greater than, or at least 0.6 V greater than, the reduction potential of the first metal precursor.

The heating optionally increases the temperature of the solution to a maximum temperature ranging from about 150° C. to about 200° C. The heating optionally comprises maintaining the maximum temperature for a period of time ranging from about 5 minutes to about 90 minutes. Optionally, the solution is cooled, after the heating, at a rate of from about 5° C./minute to about 50° C./minute to room temperature.

The processes optionally further comprise the step of adding a dispersing agent, which optionally comprises PVP, to the solution.

The nanoparticles formed from the processes of the invention optionally have an average particle size of less than about 200 nm, e.g., less than about 150 nm, or less than about 100 nm. Optionally, the nanoparticles have an average particle size of less than about 200 nm, and the nanoparticles are aggregated to form aggregates having an average particle size of from about 1 μm to about 5 μm. The nanoparticles optionally are spherical or quasi-spherical.

BRIEF DESCRIPTION OF THE DRAWINGS

The present invention will be better understood in view of the following non-limiting figures, wherein.

DETAILED DESCRIPTION OF THE PRESENT INVENTION

Introduction

Figure 1:
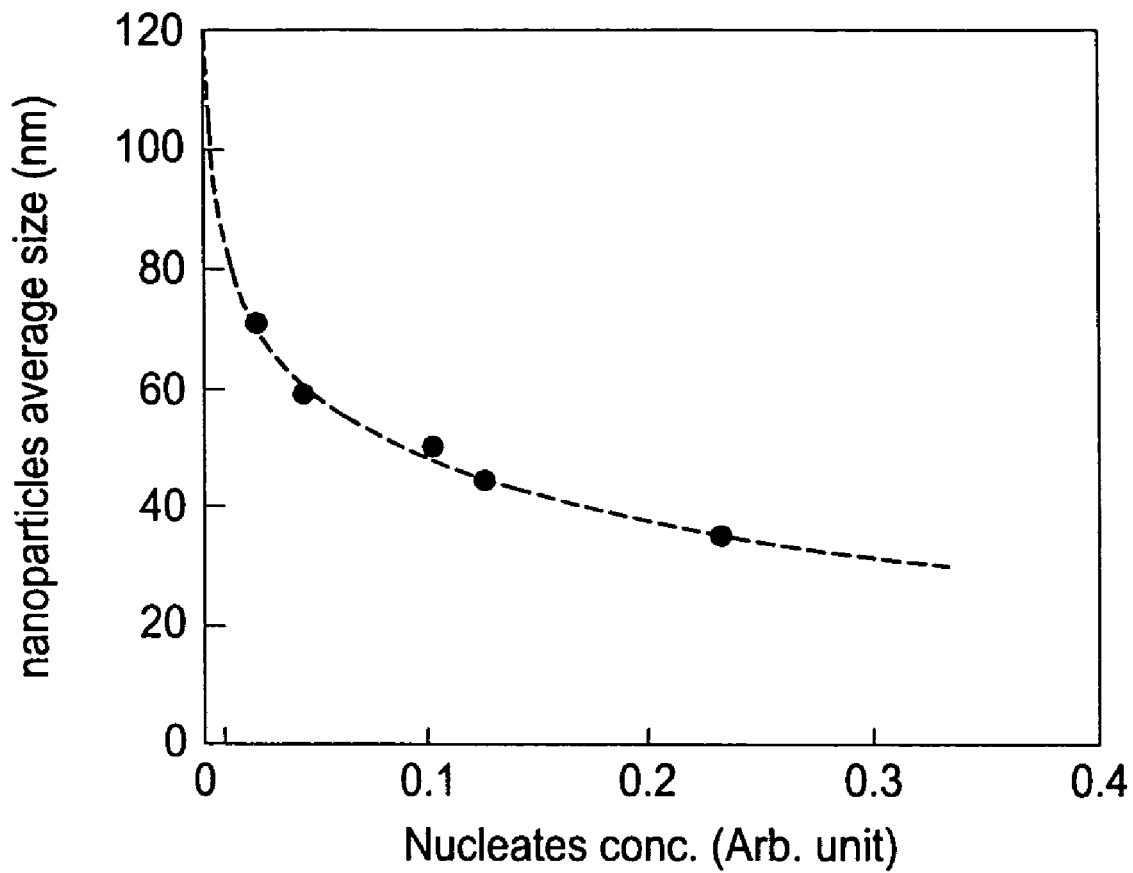
FIG. 1 presents a chart plotting nanoparticle size against nucleating agent concentration.

In several embodiments, the invention is directed to processes that advantageously provide the ability to form nanoparticles from precursors comprising cationic metal species having low reduction potentials, which is defined herein as a reduction potential less than about 0.6 V. In this context, the term "reduction potential" means the standard reduction potential of the cationic metal portion of the metal precursor, without considering the effects, if any, caused by any other species, e.g., anionic species, present in the reaction mixture.

In one embodiment, for example, the invention provides a process for forming metallic nanoparticles from a metal precursor comprising a cationic metal species having a low reduction potential. The process includes the step of heating a solution comprising a first metal precursor and a nucleating agent (e.g., nucleate nanoparticles or a nucleate precursor) in the presence of a base under conditions effective to form the nanoparticles.

In another embodiment, the invention is to a process for forming nanoparticles, the process comprising the steps of: (a) providing a solution comprising a first metal precursor to a first metal, a base, and a solvent; (b) heating the solution; (c) adding a nucleating agent (e.g., nucleate nanoparticles or a nucleate precursor) to the solution; and (d) adding a dispersing agent to the solution; wherein the process forms nanoparticles comprising the first metal. In this aspect, the nucleating agent provides a nucleate for metal nanoparticle formation. A metallic species (e.g., cationic metal species, preferably having a low reduction potential) present in the first metal precursor is reduced, e.g., by the solvent, and forms the corresponding first metal on the surface of the nucleate. Thus, the nucleate facilitates the reduction of the metallic species to form the first metal.

The invention is also directed to various nanoparticulate compositions that may be formed from precursors comprising cationic metal species having low reduction potentials. In one embodiment, for example, the present invention is to a metallic nanoparticle or a population of metallic nanoparticles formed from a metal precursor comprising a cationic metal species having a low reduction potential. In related aspects, the invention is to a powder or an ink comprising a plurality of these nanoparticles.

In a preferred aspect, the invention is to a nanoparticle, comprising: (a) a core having a largest dimension less than about 10 nm; and (b) a metal layer substantially surrounding the core and having a largest dimension less than about 200 nm. The metal layer preferably comprises a metal having a cationic form with a reduction potential less than about 0.6 V. In related aspects, the invention is to a powder or an ink comprising a plurality of these nanoparticles.

Processes of the Invention

Metal Precursor

As indicated above, the processes of the present invention involve the formation of nanoparticles by reducing a metal precursor or a portion thereof, preferably in the presence of a nucleating agent (e.g., a nucleate hetero-nanoparticle and/or a nucleate precursor) to its corresponding metal. The metal precursor that may be used in the processes of the present invention may include any metal-containing compound that can be reduced to the corresponding metal (oxidation state=0). Non-limiting examples of such metals include main group metals such as, e.g., lead, tin, antimony and indium, and transition metals such as, e.g., copper, nickel, cobalt, zinc, bismuth, osmium, ruthenium, rhenium, vanadium, chromium, manganese, niobium, molybdenum, tungsten, tantalum, iron and cadmium. Examples of preferred metals include cobalt, chromium, iron, copper and nickel, in particular, copper and nickel. In one embodiment, the metal precursor comprises a metal selected from the group consisting of: nickel, copper, cobalt, iron, and chromium. Nickel is a particularly preferred metal for the purposes of the present invention.

Preferably, the metal precursor comprises a cationic metal species when in solution. The cationic metal species preferably has a low reduction potential, defined herein as a reduction potential less than about 0.6 V, e.g., less than about 0.4 V, less than about 0.2 V or less than about 0.0 V. In this context, the term "reduction potential" means the standard reduction potential of the cationic metal portion of the metal precursor, without considering effects, if any, caused by any other species, e.g., anionic species. A non-limiting list of exemplary cationic metal species having low reduction potentials includes: $Ni^{2+}$, $Cu^+$, $Cu^{2+}$, $Co^{2+}$, $Fe^{2+}$, $Fe^{3+}$, $Pb^{2+}$, $Sn^{2+}$, $Zn^{2+}$, $In^+$, $In^{3+}$, $M^{2+}$, $Cr^{2+}$, $Cr^{3+}$, $Bi^+$, $Mo^{3+}$, $R^{3+}$, $R^{2+}$, and $W^{3+}$. Thus, the cationic metal species optionally comprises a metal selected from the group consisting of: nickel, copper, cobalt, iron, lead, tin, zinc, indium, manganese, chromium, bismuth, molybdenum, rhenium, ruthenium or tungsten. More preferably, the cationic metal species comprises a metal selected from the group consisting of: nickel, copper, cobalt, iron, and chromium.

Non-limiting examples of suitable metal precursors include metal oxides, metal hydroxides (including hydrated oxides), metal salts of inorganic and organic acids such as, e.g., nitrates, nitrites, sulfates, halides (e.g., fluorides, chlorides, bromides and iodides), carbonates, phosphates, azides, borates (including fluoroborates, pyrazolylborates, etc.), sulfonates, carboxylates (such as, e.g., formates, acetates, propionates, oxalates and citrates), substituted carboxylates (including halogenocarboxylates such as, e.g., trifluoroacetates, hydroxycarboxylates, aminocarboxylates, etc.) and salts and acids wherein the metal is part of an anion (such as, e.g., hexachloroplatinates, tetrachloroaurate, tungstates and the corresponding acids).

Further non-limiting examples of suitable metal precursors for the processes of the present invention include alkoxides, complex compounds (e.g., complex salts) of metals such as, e.g., beta-diketonates (e.g., acetylacetonates), complexes with amines, N-heterocyclic compounds (e.g., pyrrole, aziridine, indole, piperidine, morpholine, pyridine, imidazole, piperazine, triazoles, and substituted derivatives thereof), aminoalcohols (e.g., ethanolamine, etc.), amino acids (e.g., glycine, etc.), amides (e.g., formamides, acetamides, etc.), and nitriles (e.g., acetonitrile, etc.). Non-limiting examples of preferred metal precursors include nitrates, formates, acetates, trifluoroacetates, propionates, oxalates and citrates, particularly nitrates and acetates. Especially for applications of the metal nanoparticles wherein a high electrical conductivity is a desired property, the metal precursor is preferably such that the reduction by-product is volatile and/or can be decomposed into a volatile by-product at a relatively low temperature. By way of non-limiting example, the reduction of a metal nitrate will usually result in the formation of nitrogen oxide gases as the only by-products.

Non-limiting examples of specific metal precursors for use in the processes of the present invention include nickel oxide, nickel hydroxide, nickel chloride, nickel nitrate, nickel sulfate, nickel ammine complexes, nickel tetrafluoroborate, nickel oxalate, nickel isopropoxide, nickel methoxyethoxide, nickel acetylacetonate, nickel formate, nickel acetate, nickel octanoate, nickel ethylhexanoate, and nickel trifluoroacetate; copper oxide, copper hydroxide, copper nitrate, copper sulfate, copper chloride, copper formate, copper acetate, copper neodecanoate, copper ethylhexanoate, copper methacrylate, copper trifluoroacetate, copper acetoacetate and copper hexafluoroacetylacetonate; cobalt oxide, cobalt hydroxide, cobalt chloride and cobalt sulfate; ruthenium(III) chloride, ruthenium(III) acetylacetonate, ruthenium(III) acetate, ruthenium carbonyl complexes, ruthenium perchlorate, and ruthenium amine complexes; rhenium(II) chloride, tin(II) oxide, iron(II) acetate, sodium tungstate and tungstic acid. The above compounds may be employed as such or optionally in the form of solvates and the like such as, e.g., as hydrates.

Examples of specific metal precursors that may be used in the present invention include copper oxide, copper hydroxide, copper sulfate, nickel oxide, nickel hydroxide, nickel chloride, nickel sulfate, nickel acetate, cobalt oxide, cobalt hydroxide, cobalt chloride and cobalt sulfate. In a preferred aspect, the metal precursor is selected from the group consisting of nickel nitrate, nickel acetate, copper nitrate, copper acetate, cobalt nitrate, cobalt acetate, iron nitrate and iron acetate.

The use of mixtures of different compounds, e.g., different salts, of the same metal and/or the use of mixtures of compounds of different metals and/or of mixed metal precursors (e.g., mixed salts and/or mixed oxides) are also contemplated by the present invention. Accordingly, the term "metal precursor" as used herein includes both a single metal precursor and any mixture of two or more metal precursors. Depending, inter alia, on the metal precursors and reaction conditions employed, the use of more than one metal in the processes of the present invention will result in a mixture of nanoparticles of different metals and/or in nanoparticles which comprise different metals in the same nanoparticle, for example, in the form of an alloy or a mixture of these metals. In a preferred embodiment, the reaction solution comprises a first metal precursor and a second metal precursor. The first metal precursor is a precursor to a first metal, and the second metal precursor is a precursor to a second metal. The nanoparticles formed by this process comprises an alloy of the first metal and the second metal. In this aspect, the nucleate precursor forms a nucleate, and an alloy metal layer is disposed-on the surface of the nucleate. Non-limiting examples of alloys include Ni/Cu, Ni/Cr, Ni/Co, Co/Cu, Co/Cr, Ni/Fe, Fe/Cr, Fe/Co. Of course, alloys comprising more than two metals may also be formed by implementing three or more metal precursors.

Nucleating Agent

In addition to the above-described metal precursor, the solution used to form the nanoparticles of the present invention preferably comprises one or more nucleating agents.

As used herein, the term "nucleating agent" means either a metal-containing compound that may be reduced to form a nucleate (a nucleate precursor) or a hetero-nanoparticle that acts as a nucleate, e.g., silica, titania, alumina or zirconia nanoparticles. In this context, by "hetero" it is meant a nanoparticle of a different composition than the metal formed from the metal precursor. The term "nucleate," as used herein, means a particle, preferably a nanoparticle, which facilitates the reduction of the metal precursor to its corresponding metal—for example, by providing a surface on which the metal that is derived from the metal precursor may be formed. Thus, in some aspects of the processes of the present invention, the nucleating agent or a portion thereof is converted to a nucleate, on which the metal derived from the metal precursor may be formed. In other aspects, the nucleating agent actually comprises nucleate hetero-nanoparticles on which the metal derived from the metal precursor may be formed.

In general, a nucleating agent comprising a nucleate precursor (as opposed to comprising a hetero-nanoparticle that acts as a nucleate) may be selected from any of the above-described metal compounds that may be used as the metal precursor, so long as the nucleate precursor is more reactive (e.g., more easily reduced) than at least one metal precursor present in the reaction solution. Thus, the nucleate precursor should have a reduction potential that is greater than the reduction potential of the metal precursor. For the sake of brevity, the above text describing the metal precursors is incorporated in this section in its entirety as if it referred to the composition of the nucleate precursor rather than the metal precursor. In a preferred embodiment, the nucleate precursor comprises a metal selected from the group consisting of: silver, copper, platinum, palladium and gold.

The nucleating agent may also be selected from any hetero-nanoparticle, so long as the hetero-nanoparticles provide substantial surface area for the metal precursor to convert to its corresponding metal. In this manner, the hetero-nanoparticle serves as a nucleate or seed in metal nanoparticle formation. A non-limiting list of exemplary hetero-nanoparticles that may act as a nucleating agent includes silica, titania, alumina or zirconia nanoparticles. Optionally, the nucleating agent comprises a metal alloy, e.g., a metal alloy nucleate nanoparticle, selected from the group consisting of: Ag/Pt, Ag/Pd, and Ag/Au. These hetero-nanoparticles preferably are separately synthesized and dispersed in a compatible solvent system.

As indicated, the nucleate precursor (as nucleating agent) should be more easily reducible than the metal precursor. Thus, the nucleate precursor should have a reduction potential greater than the reduction potential of the metal precursor. Optionally, the nucleate precursor has a reduction potential that is at least 0.2 V greater than, e.g., at least 0.3 V greater than, at least 0.4 V greater than, at least 0.5 V greater than, at least 0.6 V greater than, the reduction potential of the metal precursor. In terms of absolute numbers, the nucleate precursor preferably has a reduction potential greater than about 0.6 V, great than about 0.7 V, or greater than about 0.8 V. In this context, the term "reduction potential" refers to the standard reduction potential of the cationic portion of the nucleate precursor.

The specific nucleate precursor selected as the nucleating agent will depend on a variety of factors such as, but not limited to, the reducibility of the nucleate precursor, the reducibility of the metal precursor(s), the solvent(s) used, the difference between the reduction potentials of the nucleate precursor and the metal precursor, the respective concentrations of the nucleate precursor and the metal precursor, the reaction temperatures implemented, the presence of dispersing agent, cost, and others. A non-limiting list of several preferred nucleate precursors includes: silver acetate, silver nitrate, silver nitrite, silver oxide, silver carbonate, silver oxalate, silver citrate, silver trifluoroacetyleacetonate, copper oxide, copper hydroxide, copper nitrate, copper sulfate, copper chloride, copper formate, copper acetate, copper neodecanoate, copper ethylhexanoate, copper methacrylate, copper trifluoroacetate, copper acetoacetate and copper hexafluoroacetylacetonate, platinum acetate, platinum nitrate, platinum formate, platinum carbonate, platinum oxalate, gold acetate, gold chloride, tetrachloroauric acid, gold acetoacetate, gold ethylhexanoate, palladium acetate, palladium propionate, palladium ethylhexanoate, palladium nitrate, palladium chloride, tetraamine palladium nitrate, tetrachloropalladate.

The concentration of nucleating agent has a significant role in controlling product nanoparticle size. Generally, the greater the concentration of the nucleating agent in a nanoparticle synthesis process, the smaller are the metallic nanoparticles formed. The relationship between the concentration of a nucleating agent (silver nitrate) and product (nickel) nanoparticle size is reflected in appended FIG. 1.

Dispersing Agent

The processes of the present invention involve converting the metal precursor, or a portion thereof, to its corresponding metal, preferably in the presence of one or more dispersing agents. During formation of the nanoparticles of the present invention, the dispersing agent preferably is adsorbed on an outer surface of the nanoparticles. The term "adsorbed" as used herein includes any kind of interaction between the dispersing agent and a nanoparticle surface (e.g., the metal atoms on the surface of a nanoparticle) that manifests itself in an at least weak bond between the dispersing agent and the surface of a nanoparticle. At least one function of dispersing agent is to inhibit substantial agglomeration of the nanoparticles formed by the processes of the present invention.

Due to their small size and the high surface energy associated therewith, the metal nanoparticles (in the absence of dispersing agent) exhibit a strong tendency to agglomerate and form larger secondary particles (for example, soft agglomerates). The dispersing agent will shield (e.g., sterically and/or through charge effects) the nanoparticles from each other to at least some extent and thereby substantially reduce or prevent a direct contact between the individual nanoparticles. Preferably, the bond is strong enough for the nanoparticle dispersing agent combination to withstand a washing operation with a solvent for the dispersing agent. In other words, merely washing the nanoparticles with the solvent at room temperature will preferably not remove more than minor amounts (e.g., less than about 10%, less than about 5%, or less than about 1%) of that part of the dispersing agent that is in direct contact with (and bonded to) the nanoparticle surface.

While the dispersing agent will usually be a single substance or at least comprise substances of the same type, the present invention also contemplates the use of two or more different types of dispersing agents. For example, a mixture of two or more different low molecular weight compounds or a mixture of two or more different polymers may be used, as well as a mixture of one or more low molecular weight compounds and one or more polymers. The term "dispersing agent" as used herein includes all of these possibilities. One of skill in the art will understand that volatile components of the mixture such as, e.g., the polyol and/or other solvent may also have a tendency of being adsorbed on the nanoparticle surface. These substances do not qualify as "dispersing agents" within the meaning of this term as used herein.

The dispersing agent should preferably be compatible with the polyol in the heated solution, i.e., it preferably does not react with the polyol to any significant extent, even at the elevated temperatures that will often be employed in the process of the present invention. If the heated solution does not comprise any other solvent for the dispersing agent, the substance should also dissolve in the polyol to at least some extent. The dispersing agent will usually have a solubility at room temperature of at least about 1 g per liter of solvent (including solvent mixtures), e.g., at least about 5 g, at least about 10 g, or at least about 20 g per liter of solvent. Preferably, the dispersing agent has a solubility of at least about 100 g, e.g., at least about 200 g, or at least about 300 g per liter of solvent.

A preferred and non-limiting example of a dispersing agent for use in the process of the present invention includes a substance that is capable of electronically interacting with a metal atom of a nanoparticle. A specific, non-limiting example of a dispersing agent is polyvinylpyrrolidone (PVP). Usually, a substance that is capable of this type of interaction will comprise one or more atoms (e.g., at least two atoms) with one or more free electron pairs such as, e.g., oxygen, nitrogen, phosphorus, and sulfur. By way of non-limiting example, the dispersing agent may be capable of a dative interaction with a metal atom on the surface of a nanoparticle and/or of chelating the metal atom. Particularly preferred dispersing agents comprise one or two O and/or N atoms. The atoms with a free electron pair will usually be present in the substance in the form of a functional group such as, e.g., a hydroxy group, a carbonyl group, an ether group, a phosphate group, and an amino group, or as a constituent of a functional group that comprises one or more of these groups as a structural element thereof. Non-limiting examples of suitable functional groups include —COO—, —O—CO—O—, —CO—O—CO—, —C—O—C—, RPO$_4$—, RP$_2$O$_7$—, RP$_3$O$_{10}$—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms). Such functional groups may comprise the above (and other) structural elements as part of a cyclic structure (e.g., in the form of a cyclic ester, amide, anhydride, imide, carbonate, urethane, urea, and the like).

The dispersing agents may comprise a low molecular weight compound, preferably a low molecular weight organic compound, e.g., a compound having a molecular weight of not higher than about 500, more preferably not higher than about 300, and/or may comprise an oligomeric or polymeric compound having a (weight average) molecular weight (in Daltons) of at least about 1,000, for example, at least about 3,000, at least about 5,000, or at least about 8,000, but preferably not higher than about 500,000, e.g., not higher than about 200,000, or not higher than about 100,000. Too high a molecular weight may give rise to an undesirably high viscosity of the solution at a desirable concentration of the dispersing agent and/or cause flocculation. Also, the most desirable molecular weight may be dependent on the metal. By way of non-limiting example, in the case of polyvinylpyrrolidone, a particularly preferred weight average molecular weight is in the range of from about 3,000 to about 60,000.

In general, it is preferred for the dispersing agent to have a total of at least about 10 atoms per molecule which are selected from C, N and O, e.g., at least about 20 such atoms or at least about 50 such atoms. More preferably, the dispersing agent has a total of at least about 10° C., N and O atoms per molecule, e.g., at least about 200, at least about 300, or at least about 40° C., N and O atoms per molecule. In the case of polymers these numbers refer to the average per polymer molecule.

Non-limiting examples of the low molecular weight dispersing agent for use in the present invention include fatty acids, in particular, fatty acids having at least about 8 carbon atoms. Non-limiting examples of oligomers/polymers for use as the dispersing agent in the processes of the present invention include homo- and copolymers (including polymers such as, e.g., random copolymers, block copolymers and graft copolymers) which comprise units of at least one monomer which comprises one or more O atoms and/or one or more N atoms. A non-limiting class of preferred polymers for use in the present invention is constituted by polymers which comprise at least one monomer unit which includes at least two atoms which are selected from O and N atoms. Corresponding monomer units may, for example, comprise at least one hydroxyl group, carbonyl group, ether linkage and/or amino group and/or one or more structural elements of formula —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms).

Non-limiting examples of corresponding polymers include polymers which comprise one or more units derived from the following groups of monomers:

(a) monoethylenically unsaturated carboxylic acids of from about 3 to about 8 carbon atoms and salts thereof. This group of monomers includes, for example, acrylic acid, methacrylic acid, dimethylacrylic acid, ethacrylic acid, maleic acid, citraconic acid, methylenemalonic acid, allylacetic acid, vinylacetic acid, crotonic acid, fumaric acid, mesaconic acid and itaconic acid. The monomers of group (a) can be used either in the form of the free carboxylic acids or in partially or completely neutralized form. For the neutralization alkali metal bases, alkaline earth metal bases, ammonia or amines, e.g., sodium hydroxide, potassium hydroxide, sodium carbonate, potassium carbonate, sodium bicarbonate, magnesium oxide, calcium hydroxide, calcium oxide, ammonia, triethylamine, methanolamine, diethanolamine, triethanolamine, morpholine, diethylenetriamine or tetraethylenepentamine may, for example, be used;

(b) the esters, amides, anhydrides and nitriles of the carboxylic acids stated under (a) such as, e.g., methyl acrylate, ethyl acrylate, methyl methacrylate, ethyl methacrylate, n-butyl acrylate, hydroxyethyl acrylate, 2- or 3-hydroxypropyl acrylate, 2- or 4-hydroxybutyl acrylate, hydroxyethyl methacrylate, 2- or 3-hydroxypropyl methacrylate, hydroxyisobutyl acrylate, hydroxyisobutyl methacrylate, monomethyl maleate, dimethyl maleate, monoethyl maleate, diethyl maleate, maleic anhydride, 2-ethylhexyl acrylate, 2-ethylhexyl methacrylate, acrylamide, methacrylamide, N,N-dimethylacrylamide, N-tert-butylacrylamide, acrylonitrile, methacrylonitrile, 2-dimethylaminoethyl acrylate, 2-dimethylaminoethyl methacrylate, 2-diethylaminoethyl acrylate, 2-diethylaminoethyl methacrylate and the salts of the last-mentioned monomers with carboxylic acids or mineral acids and the quaternized products;

(c) acrylamidoglycolic acid, vinylsulfonic acid, allylsulfonic acid, methallylsulfonic acid, styrenesulfonic acid, 3-sulfopropyl acrylate, 3-sulfopropyl methacrylate and acrylamidomethylpropanesulfonic acid and monomers containing phosphonic acid groups, such as, e.g., vinyl phosphate, allyl phosphate and acrylamidomethylpropanephosphonic acid; and esters, amides and anhydrides of these acids;

(d) N-vinyllactams such as, e.g., N-vinylpyrrolidone, N-vinyl-2-piperidone and N-vinylcaprolactam; and (e) vinyl acetal, vinyl butyral, vinyl alcohol and ethers and esters thereof (such as, e.g., vinyl acetate, vinyl propionate and methylvinylether), allyl alcohol and ethers and esters thereof, N-vinylimidazole, N-vinyl-2-methylimidazoline, and the hydroxystyrenes.

Corresponding polymers may also contain additional monomer units, for example, units derived from monomers without functional group, halogenated monomers, aromatic monomers etc. Non-limiting examples of such monomers include olefins such as, e.g., ethylene, propylene, the butenes, pentenes, hexenes, octenes, decenes and dodecenes, styrene, vinyl chloride, vinylidene chloride, tetrafluoroethylene, etc. Further, the polymers for use as dispersing agent in the process of the present invention are not limited to addition polymers, but also comprise other types of polymers, for example, condensation polymers such as, e.g., polyesters, polyamides, polyurethanes and polyethers, as well as polysaccharides such as, e.g., starch, cellulose and derivatives thereof, etc.

Other non-limiting examples of polymers which are suitable for use as dispersing agent in the present invention are disclosed in e.g., U.S. Patent Application Publication 2004/0182533 A1, the entire disclosure whereof is expressly incorporated by reference herein.

Preferred polymers for use as dispersing agent in the present invention include those which comprise units derived from one or more N-vinylcarboxamides of formula (I)

$$CH_2=CH-NR^3-CO-R^4 \qquad (I)$$

wherein $R^3$ and $R^4$ independently represent hydrogen, optionally substituted alkyl (including cycloalkyl) and optionally substituted aryl (including alkaryl and aralkyl) or heteroaryl (e.g., $C_{6-20}$ aryl such as phenyl, benzyl, tolyl and phenethyl, and $C_{4-20}$ heteroaryl such as pyrrolyl, furyl, thienyl and pyridinyl).

$R^3$ and $R^4$ may, e.g., independently represent hydrogen or $C_{1-12}$ alkyl, particularly $C_{1-6}$ alkyl such as methyl and ethyl. $R^3$ and $R^4$ together may also form a straight or branched chain containing from about 2 to about 8, preferably from about 3 to about 6, particularly preferably from about 3 to about 5 carbon atoms, which chain links the N atom and the C atom to which $R^3$ and $R^4$ are bound to form a ring which preferably has about 4 to about 8 ring members. Optionally, one or more carbon atoms may be replaced by heteroatoms such as, e.g., oxygen, nitrogen or sulfur. Also optionally, the ring may contain a carbon-carbon double bond.

Non-limiting specific examples of $R^3$ and $R^4$ are methyl, ethyl, isopropyl, n-propyl, n-butyl, isobutyl, sec-butyl, tert-butyl, n-hexyl, n-heptyl, 2-ethylhexyl, n-octyl, n-decyl, n-undecyl, n-dodecyl, n-tetradecyl, n-hexadecyl, n-octadecyl and n-eicosyl. Non-limiting specific examples of $R^3$ and $R^4$ which together form a chain are 1,2-ethylene, 1,2-propylene, 1,3-propylene, 2-methyl-1,3-propylene, 2-ethyl-1,3-propylene, 1,4-butylene, 1,5-pentylene, 2-methyl-1,5-pentylene, 1,6-hexylene and 3-oxa-1,5-pentylene.

Non-limiting specific examples of N-vinylcarboxamides of formula (I) are N-vinylformamide, N-vinylacetamide, N-vinylpropionamide, N-vinylbutyramide, N-vinylisobutyramide, N-vinyl-2-ethylhexanamide, N-vinyldecanamide, N-vinyldodecanamide, N-vinylstearamide, N-methyl-N-vinylformamide, N-methyl-N-vinylacetamide, N-methyl-N-vinylpropionamide, N-methyl-N-vinylbutyramide, N-methyl-N-vinylisobutyramide, N-methyl-N-vinyl-2-ethylhexanamide, N-methyl-N-vinyldecanamide, N-methyl-N-vinyldodecanamide, N-methyl-N-vinylstearamide, N-ethyl-N-vinylformamide, N-ethyl-N-vinylacetamide, N-ethyl-N-vinylpropionamide, N-ethyl-N-vinylbutyramide, N-ethyl-N-vinylisobutyramide, N-ethyl-N-vinyl-2-ethylhexanamide, N-ethyl-N-vinyldecanamide, N-ethyl-N-vinyldodecanamide, N-ethyl-N-vinylstearamide, N-isopropyl-N-vinylformamide, N-isopropyl-N-vinylacetamide, N-isopropyl-N-vinylpropionamide, N-isopropyl-N-vinylbutyramide, N-isopropyl-N-vinylisobutyramide, N-isopropyl-N-vinyl-2-ethylhexanamide, N-isopropyl-N-vinyldecanamide, N-isopropyl-N-vinyldodecanamide, N-isopropyl-N-vinylstearamide, N-n-butyl-N-vinylformamide, N-n-butyl-N-vinylacetamide, N-n-butyl-N-vinylpropionamide, N-n-butyl-N-vinylbutyramide, N-n-butyl-N-vinylisobutyramide, N-n-butyl-N-vinyl-2-ethylhexanamide, N-n-butyl-N-vinyldecanamide, N-n-butyl-N-vinyldodecanamide, N-n-butyl-N-vinylstearamide, N-vinylpyrrolidone, N-vinyl-2-piperidone and N-vinylcaprolactam.

Particularly preferred polymers for use in the present invention include polymers which comprise monomer units of one or more unsubstituted or substituted N-vinyllactams, preferably those having from about 4 to about 8 ring members such as, e.g., N-vinylcaprolactam, N-vinyl-2-piperidone and N-vinylpyrrolidone. These polymers include homo- and copolymers. In the case of copolymers (including, for example, random, block and graft copolymers), the N-vinyllactam (e.g., N-vinylpyrrolidone) units are preferably present in an amount of at least about 10 mole-%, e.g., at least about 30 mole-%, at least about 50 mole-%, at least about 70 mole-%, at least about 80 mole-%, or at least about 90 mole-%. By way of non-limiting example, the comonomers may comprise one or more of those mentioned in the preceding paragraphs, including monomers without functional group (e.g., ethylene, propylene, styrene, etc.), halogenated monomers, etc.

If the vinyllactam (e.g., vinylpyrrolidone) monomers (or at least a part thereof) carry one or more substituents on the heterocyclic ring, non-limiting examples of such substituents include alkyl groups (for example, alkyl groups having from 1 to about 12 carbon atoms, e.g., from 1 to about 6 carbon atoms such as, e.g., methyl, ethyl, propyl and butyl), alkoxy groups (for example, alkoxy groups having from 1 to about 12 carbon atoms, e.g., from 1 to about 6 carbon atoms such as, e.g., methoxy, ethoxy, propoxy and butoxy), halogen atoms (e.g., F, Cl and Br), hydroxy, carboxy and amino groups (e.g., dialkylamino groups such as dimethylamino and diethylamino) and any combinations of these substituents.

Non-limiting specific examples of vinyllactam polymers for use in the present invention include homo- and copolymers of vinylpyrrolidone which are commercially available from, e.g., International Specialty Products (www.ispcorp.com). In particular, these polymers include (a) vinylpyrrolidone homopolymers such as, e.g., grades K-15 and K-30 with K-value ranges of from 13-19 and 26-35, respectively, corresponding to average molecular weights (determined by GPC/MALLS) of about 10,000 and about 67,000;

(b) alkylated polyvinylpyrrolidones such as, e.g., those commercially available under the trade mark GANEX® which are vinylpyrrolidone-alpha-olefin copolymers that contain most of the alpha-olefin (e.g., about 80% and more) grafted onto the pyrrolidone ring, mainly in the 3-position thereof; the alpha-olefins may comprise those having from about 4 to about 30 carbon atoms; the alpha-olefin content of these copolymers may, for example, be from about 10% to about 80% by weight;

(c) vinylpyrrolidone-vinylacetate copolymers such as, e.g., random copolymers produced by a free-radical polymerization of the monomers in a molar ratio of from about 70/30 to about 30/70 and having weight average molecular weights of from about 14,000 to about 58,000;

(d) vinylpyrrolidone-dimethylaminoethylmethacrylate copolymers;

(e) vinylpyrrolidone-methacrylamidopropyl trimethylammonium chloride copolymers such as, e.g., those commercially available under the trade mark GAFQUAT®;

(f) vinylpyrrolidone-vinylcaprolactam-dimethylaminoethylmethacrylate terpolymers such as, e.g., those commercially available under the trade mark GAFFIX®;

(g) vinylpyrrolidone-styrene copolymers such as, e.g., those commercially available under the trade mark POLECTRON®; a specific example thereof is a graft emulsion copolymer of about 70% vinylpyrrolidone and about 30% styrene polymerized in the presence of an anionic surfactant;

(h) vinylpyrrolidone-acrylic acid copolymers such as, e.g., those commercially available under the trade mark ACRYLIDONE® which are produced in the molecular weight range of from about 80,000 to about 250,000.

The most desirable ratio of the metal precursor and the dispersing agent is a function of a variety of factors. In this regard, it is to be appreciated that the dispersing agent will generally have multiple functions. These functions include, of course, a substantial prevention of an agglomeration of the nanoparticles and, as a result thereof, facilitating an isolation of the nanoparticles from the reaction mixture, ensuring a substantial redispersibility of the isolated nanoparticles and a stabilization of dispersions comprising these nanoparticles. Another function of the dispersing agent usually comprises assisting in the control of the size and shape of nanoparticles during the reduction of the metal precursor. For example, if the amount of dispersing agent is not sufficient to shield the growing nanoparticles completely, the formation of particles with a high aspect ratio such as, e.g., nanorods and/or nanowires and/or irregularly shaped particles may be observed. Also, under otherwise identical conditions, the average size of the formed nanoparticles will usually decrease with increasing molar ratio of dispersing agent and metal precursor. It has been found that under otherwise identical conditions, the rapid mixing of the solution of the metal precursor and the heated solution according to the process of the present invention allows to obtain substantially the same results with respect to the control of the size, the size distribution and/or the shape of the particles as the known method with its gradual dissolution/reaction of the metal precursor in the presence of the adsorptive compound, but at a (substantially) lower molar ratio of the adsorptive compound and the metal precursor than required in the known method. At any rate, the dispersing agent should be present in at least the amount that is sufficient to substantially inhibit or prevent an agglomeration of the nanoparticles. This amount is at least in part dependent on the size of the metal cores of the formed nanoparticles.

By way of non-limiting example, a batch of dry nanoparticles will usually require a minimum of surface passivation or surface coverage by the dispersing agent in order to be redispersible. A simple rule of thumb is that the smaller the particle size the larger the surface area and thus, the more dispersing agent is required for complete coverage. Depending on the dispersing agent, one can make some simple assumptions regarding the thickness of a monolayer of dispersing agent that is adsorbed on the surface of the metal cores of the nanoparticles. In addition, one may also assume that a minimum of one monolayer of dispersing agent around a nanoparticle is needed to allow for complete dispersibility of dry particles. Usually, not more than about 10 monolayers (and often not more than about 5 monolayers or even not more than about 2 monolayers) of dispersing agent are needed to redisperse and stabilize a metal nanoparticle in solution. With this simple model one may make a rough estimate of the amount of dispersing agent that is needed to (re)disperse metal nanoparticles of any size. For example, for PVP as the dispersing agent, one may assume that the thickness of a monolayer thereof is about 2 nm. Based on this model and using the densities of Ni ($8.908$ $g/cm^3$) and PVP ($1.0$ $g/cm^3$) one can calculate that for a PVP coated sphere-shaped nanoparticle having a diameter of 30 nm the minimum amount of PVP needed to disperse a dry particle is about 4.9% by weight (one monolayer). Preferably, not more than 10 monolayers or 56.8% by weight of PVP will be present. Most preferably, about 1 to about 5 monolayers or about 4.9% to about 29.0% by weight of PVP will be used. For a 50 nm sphere-shaped Ni nanoparticle, a minimum of about 2.8% by weight of PVP will needed to cover the nanoparticle completely with a monolayer. No more than about 35.2% by weight or 10 monolayers will usually be needed. Most preferably about 2.8 to about 16.4% by weight of PVP is used (for about 1 to about 5 monolayers).

If the dispersing agent is or comprises a low molecular weight compound (i.e., one or more low molecular weight compounds, collectively referred to herein as a single compound), the molar ratio of the low molecular weight compound and the metal in the reaction mixture will often be at least about 3:1, e.g., at least about 5:1, or at least about 10:1. While there is no particular upper limit for this ratio, for practical reasons and reasons of economic efficiency one will usually avoid a substantially higher amount of dispersing agent than the amount that is needed for obtaining particles in the desired size range and/or for substantially preventing agglomeration of the nanoparticles.

If the dispersing agent is or comprises a polymer (i.e., one or more polymers, collectively referred to herein as a single polymer), the molar ratio in the reaction mixture of the monomer units of the polymer (and preferably of only those monomer units that are capable of being adsorbed on the nanoparticles), and the metal will often be at least about 3:1, e.g., at least about 5:1, at least about 6:1, at least about 8:1, or at least about 10:1. However, for practical reasons (in particular in view of the viscosity increasing effect of certain polymers) and for reasons of economic efficiency (excess dispersing agent, i.e., substance that will not be adsorbed may have to be removed and discarded/recycled later) this ratio will usually be not higher than about 100:1, e.g., not higher than about 80:1, not higher than about 50:1, not higher than about 30:1, or not higher than about 20:1.

Solvent System

The metal precursor should be soluble to at least some extent in at least one solvent, preferably a polyol, so that there is no substantial precipitation or other separation of the metal precursor from the liquid phase when the solution of the metal precursor is contacted with the heated solution.

The solvent implemented in the processes of the present invention preferably comprises one or more polyols. The polyol for use in the present invention may be a single polyol or a mixture of two or more polyols (e.g., three, four or five polyols). In the following description, whenever the term "polyol" is used, this term is meant to include both a single polyol and a mixture of two or more polyols. The polyol may have any number of hydroxyl groups (but at least two) and carbon atoms. Also, the polyol may comprise heteroatoms (such as, e.g., O and N), not only in the form of hydroxyl groups, but also in the form of, e.g., ether, ester, amine and amide groups and the like (for example, it may be a polyester polyol, a polyether polyol, etc.). Preferably, the polyol comprises from about 2 to about 6 hydroxy groups (e.g., 2, 3 or 4 hydroxy groups). Also, the preferred polyol comprises from 2 to about 12 carbon atoms, e.g., up to about 3, 4, 5 or 6 carbon atoms. A particularly preferred group of polyols for use in the present invention are the (alkylene) glycols, i.e., compounds which comprise two hydroxyl groups bound to adjacent (aliphatic or cycloaliphatic) carbon atoms. Usually these glycols will comprise up to about 6 carbon atoms, e.g., 2, 3 or 4 carbon atoms. Ethylene glycol, propylene glycol and the butylene glycols are non-limiting examples of preferred glycols for use in the present invention.

The polyglycols constitute another group of preferred polyols for use in the present invention. Specific and preferred examples thereof are compounds which comprise up to about 6 alkylene glycol units, e.g., up to 4 alkylene glycol units, such as, e.g., diethylene glycol, triethylene glycol, tetraethylene glycol, dipropylene glycol and tripropylene glycol.

Non-limiting examples of other specific compounds which may advantageously be used as the polyol in the processes of the present invention include 1,3-propanediol, 1,3-butanediol, 1,4-butanediol, glycerol, trimethylolpropane, pentaerythritol, triethanolamine and trihydroxymethylaminomethane. In a preferred embodiment, the solution comprises a solvent selected from the group consisting of a polyol, ethylene glycol, propylene glycol (1,3-propane diol), diethylene glycol and combinations thereof.

Of course, it also is possible to use other polyols than those mentioned above, either alone or in combination. For example, sugars and sugar alcohols can form at least a part of the polyol reactant of the process of the present invention.

While polyols that are solid or semi-solid at room temperature may be employed, it is preferred that the employed polyol or at least the employed mixture of polyols is liquid at room temperature, although this is not mandatory. Further, it is also possible to use one or more other reducing agents in conjunction with the polyol(s), for example, in order to reduce the required reaction time and/or the reaction temperature. For instance, the substance that is capable of being adsorbed on the nanoparticles may exhibit a reducing effect with respect to the metal precursor. A non-limiting example of such a substance is polyvinylpyrrolidone. Non-limiting examples of other reducing agents which may be employed in accordance with the present invention include hydrazine and derivatives thereof, hydroxylamine and derivatives thereof, aldehydes such as, e.g., formaldehyde, hypophosphites, sulfites, tetrahydroborates (such as, e.g., the tetrahydroborates of Li, Na, K), $LiAlH_4$, polyhydroxybenzenes such as, e.g., hydroquinone, alkyl-substituted hydroquinones, catechols and pyrogallol; phenylenediamines and derivatives thereof; aminophenols and derivatives thereof; ascorbic acid and ascorbic acid ketals and other derivatives of ascorbic acid; 3-pyrazolidone and derivatives thereof; hydroxytetronic acid, hydroxytetronamide and derivatives thereof; bisnaphthols and derivatives thereof; sulfonamidophenols and derivatives thereof; and Li, Na and K.

The solvent for the metal precursor may be a single solvent or a mixture of two or more solvents/diluents (collectively referred to herein as "solvent" or "solvent for the metal precursor"). The solvent is preferably capable of dissolving a significant amount of the metal precursor at room temperature and/or at the temperature that the solution of the metal precursor is intended to have when it is combined with the heated polyol solution. Usually the solvent will dissolve the metal precursor at room temperature in an amount of at least about 1 g/l, e.g., at least about 5 g/l, or at least about 10 g/l. Preferably, the metal precursor dissolves in the solvent in an amount of at least about 50 g/l, e.g., at least about 100 g/l, at least about 200 g/l, or at least about 300 g/l. In this regard, it is to be appreciated that one or more components of the solvent may be poor solvents for the metal precursor as long as the entirety of the solvent, i.e., all components thereof, are capable of dissolving the metal precursor to the desired extent. The solvent for the metal precursor should preferably also be miscible with the polyol of the heated solution to at least some extent. Also, the solvent for the metal precursor is preferably of high purity. This applies also to any other liquids/solvents that are used in the process of the present invention.

It is to be understood that the solution of the metal precursor may still contain some undissolved metal precursor, although this is not preferred. By way of non-limiting example, not more than about 20 weight percent, e.g., not more than about 10 weight percent, or not more than about 5 weight percent, of the metal precursor may be present in undissolved form. Preferably, the amount of undissolved metal precursor is not higher than about 1 weight percent, even more preferred not higher than about 0.1 weight percent. Most preferably, the solution is substantially free of undissolved metal precursor (e.g., not higher than about 0.01 weight percent, or not higher than about 0.001 weight percent of undissolved metal precursor). If undissolved metal precursor is present, it is preferred for it to be dissolved substantially immediately upon contact with the heated solution, for example, within less than about one minute (e.g., less than about 30 seconds). Especially in cases where the temperature difference between the solution of the metal precursor and the heated solution is large (e.g., larger than about 40° C.), it may be particularly advantageous to employ a highly concentrated and in particular, a substantially saturated solution of the metal precursor (preferably in a good solvent therefor) in order to keep the temperature drop relative to the temperature of the heated solution upon combining the solutions small.

As indicated above, in a preferred aspect of the method of the present invention, the solvent for the metal precursor is or at least comprises one or more polyols, preferably the same polyol(s) that is/are present in the heated solution. It is noted however, that the use of one or more polyols for dissolving the metal precursor is not mandatory. Other solvents may be used as well, such as, e.g., protic and aprotic polar solvents. Non-limiting examples of such solvents include aliphatic, cycloaliphatic and aromatic alcohols (the term "alcohol" as used herein is used interchangeably with the terms "monoalcohol" and "monohydric alcohol") such as, e.g., ethanol, propanol, butanol, pentanol, cyclopentanol, hexanol, cyclohexanol, octanol, decanol, isodecanol, undecanol, dodecanol, benzyl alcohol, butyl carbitol and the terpineols, ether alcohols such as, e.g., the monoalkyl ethers of diols such as, e.g., the $C_{1-6}$ monoalkyl ethers of $C_{1-6}$ alkanediols and polyetherdiols derived therefrom (e.g., the monomethyl, monoethyl, monopropyl and monobutyl ethers of ethylene glycol, diethylene glycol, triethylene glycol, propylene glycol, dipropylene glycol, 1,3-propanediol, and 1,4-butanediol such as, e.g, 2-methoxyethanol, 2-ethoxyethanol, 2-propoxyethanol and 2-butoxyethanol), aminoalcohols such as, e.g., ethanolamine, amides such as, e.g., dimethylformamide, dimethylacetamide 2-pyrrolidone and N-methylpyrrolidone, esters such as, e.g., ethyl acetate and ethyl formate, sulfoxides such as, e.g., dimethylsulfoxide, ethers such as, e.g., tetrahydrofuran and tetrahydropyran, and water. These and other suitable solvents may be used alone or as a mixture of two or more thereof and/or in combination with one or more polyols. By the same token, it is possible for the heated solution to comprise one or more solvents in addition to the one or more polyols included therein. By way of non-limiting example, the heated solution may additionally comprise solvents such as those that may be present in the solution of the metal precursor. However, in the combined solutions (solution of metal precursor and heated solution) the concentration of polyol(s) should be sufficiently high to bring about a reduction of at least a substantial portion (and preferably, substantially all) of the metal precursor within a commercially acceptable period of time (for example, within not more than about 24 hours, preferably not more than about 12 hours or not more than about 6 hours) when the mixture is heated to a temperature that does not cause a substantial decomposition of any of the components that are present in the mixture.

The solution containing the metal precursor and nucleate precursor preferably is basic. Preferably, the conversion of the metal precursor to its corresponding metal preferably occurs in the presence of a base. The base optionally comprises a hydroxide. A non-limiting list of bases that may be used in the processes of the present invention includes: sodium hydroxide, potassium hydroxide, and ammonium hydroxide. Organic bases can be used for the same purpose. Preferably, the organic base comprises an amine or imine. A non-limiting lost of organic bases includes: alkylamine, alcoholamine, lysine, ornithine, purine, pyrimidine. Preferably, the solution comprises the base sufficient to convert the metal precursor to one or more intermediate compounds for metal nanoparticle formation. The mole ratio of a base to metal precursor is preferably greater than about 0.1, e.g., greater than about 0.5, greater than about 1.0, or greater than about 2.0.

Without being bound by any theory, the presence of base in the solution is believed to facilitate the conversion of the metal precursor to one or more intermediate compounds which are subsequently converted to the corresponding metal. In one embodiment, for example, the metal precursor comprises nickel acetate, and the base facilitates the conversion of the nickel acetate to a nickel hydroxide ($Ni(OH)_2$) precipitant, which is subsequently converted in an equilibrium reaction to $Ni(OH)_x$. The $Ni(OH)_x$ intermediate is then converted to nickel metal (oxidation state=0) on the surface of a nucleate.

Reaction Conditions and Procedure

In one embodiment, the present invention is to a process that includes a step of providing a solution comprising a metal precursor to a metal, a base and a solvent. The process also includes steps of heating the solution and adding a nucleate precursor (as nucleating agent) to the solution. In this aspect, the addition of the nucleate precursor may occur before, during or (less desirably) after the heating step. After heating, the solution is cooled, preferably to about room temperature.

The process also preferably includes a step of adding a dispersing agent to the solution. The step of adding the dispersing agent to the solution similarly may occur before, during or after the heating step. Preferably, the step of adding the dispersing agent to the solution occurs during or after the heating step. The timing of the addition of the dispersing agent may vary widely depending on many factors, such as the specific metal precursor used. In the specific nickel example described above, without being bound by any theory, a color change from brown to black is observed as nickel is formed on the nucleate particles. The dispersing agent preferably is added soon after this color change is observed (e.g., within about 5 minutes, about 10 minutes, or about 15 minutes).

Optionally, the dispersing agent is added to the solution from about 2 to about 30 minutes before beginning the step of cooling the solution, e.g., from about 5 to about 20 minutes before cooling, from about 10 to about 20 minutes before cooling, or from about 10 to about 15 minutes before cooling. In other aspects, the dispersing agent is added from about 2 to about 30 minutes after the maximum temperature has been achieved, e.g., from about 5 to about 20 minutes after the maximum temperature has been achieved, from about 10 to about 20 minutes after the maximum temperature has been achieved, or from about 10 to about 15 minutes after the maximum temperature has been achieved. In one aspect, the step of adding the dispersing agent to the solution occurs prior to heating. It is important to find the best addition time of dispersing agent to maximize the surface interaction between dispersing agent and metal nanoparticle. Depending on a surface chemistry, one might need to add a dispersing agent at a different time.) In order to minimize the formation of hot and cold zones in the reaction mixture, the dispersing agent preferably is heated to a temperature similar to that of the reaction mixture prior to its addition to the reaction mixture.

It is also preferred according to the present invention to promote the complete mixing of the components contained in the solution by agitation such as, e.g., by (preferably vigorous) stirring, high-shear mixing and/or sonication of the combined solutions.

As described above, in the processes of the present invention, a solution comprising the metal precursor and preferably the nucleating agent is heated in the presence of base under conditions effective to form nanoparticles. The heating step facilitates the conversion of the metal precursor, or an intermediate compound formed therefrom, to another intermediate compound and/or to its corresponding metal. With respect to the formation of nickel-containing nanoparticles in the reaction presented above, without being bound by any theory, the heating step pushes the equilibrium reaction $Ni(OH)_2 \leftrightarrow Ni(OH)_x$ to the right, thereby increasing the amount of $Ni(OH)_x$ present in the solution and favoring the synthesis of elemental nickel from the $Ni(OH)_x$.

The reaction rate depends, inter alia, on the temperature at which the reaction mixture is heated. It will usually be advantageous to heat the mixed solutions to an elevated temperature (if they are not at the desired temperature already) and to keep them at this temperature for a sufficient period to convert at least a substantial portion of, and preferably substantially the entire metal precursor (e.g., at least about 90%, or at least about 95% thereof) to metal nanoparticles. The temperature that is needed to achieve a desired degree of conversion within a predetermined period of time depends, inter alia, on the reactivities and concentrations of the reactants. Of course, the reaction temperature should not be so high as to cause a more than insignificant decomposition of the various components of the reaction mixture (e.g., of the dispersing agent). Also, the temperature will usually be not significantly higher than the boiling point of the lowest-boiling component of the reaction mixture, although this is not mandatory, especially if the reaction mixture is kept under a higher than atmospheric pressure, e.g., in an autoclave. In many cases, the reaction mixture will be heated to/kept at a temperature of at least about 130° C., e.g., at least about 140° C., at least about 150° C., at least about 160° C., or at least about 170° C. On the other hand, it will usually be advantageous for the temperature of the reaction mixture to not exceed about 200° C., e.g., to not exceed about 190° C., to not exceed about 180° C., or to not exceed about 170° C.

Especially (but not only) in cases where the volume of the liquid phase is kept relatively small relative to the amount of components dissolved therein and/or the reaction temperature is relatively close to the boiling point of the liquid phase or a component thereof, respectively, and no reflux is provided for, it may be advantageous to add additional solvent, in particular, a polyol to the reaction mixture.

The solution preferably is heated to a maximum temperature of at least about 120° C., e.g., at least about 130° C., at least about 140° C., at least about 150° C., at least about 160° C., at least about 170° C., or at least about 180° C. On the other hand, the maximum temperature of the heated solution will usually be not higher than about 200° C., e.g., not higher than about 190° C., not higher than about 180° C., not higher than about 170° C., or not higher than about 160° C. In terms of ranges, the maximum temperature preferably ranges from about 140° C. to about 200° C., e.g., from about 150° C. to about 190° C. or from about 160° C. to about 180° C. The most suitable temperature of the heated solution is at least in part determined by factors such as the boiling point of the solvent(s) included therein, the thermal stability of the dispersing agent (if present), the reactivities of the metal precursor, the nucleating agent and the optional polyol, and the temperature of the solution of the metal precursor and the volume thereof relative to the heated solution.

The heating step preferably provides sufficient heat so as to increase the temperature of the solution at a rate of from about 2° C./min. to about 30° C./min, e.g., from about 3 to about 25° C./min, or from about 5 to about 20° C./min. Preferably, the heating step heats the solution from room temperature to the maximum temperature at a substantially constant rate, e.g., at a rate that does not vary by more than about 2° C./min, by more than about 1° C./min, or by more than about 0.5° C./min.

The heating step also preferably comprises maintaining the solution at the maximum temperature for a period of time. The period of time that the maximum temperature is maintained may vary depending upon factors such as reactivity of a metal precursor, stability of produced metal nanoparticles, boiling point of a polyol used, and stability of a dispersing agent. In various embodiments, the maximum temperature of the solution (±about 2° C.) optionally is maintained for a period of time ranging from about 5 to about 90 minutes, e.g., from about 5 to about 70 minutes, from about 5 to about 50 minutes, from about 5 to about 30 minutes or from about 5 to about 20 minutes. In various specific embodiments, the maximum temperature is maintained for a period of time of about 5 minutes, about 10 minutes, about 15 minutes, about 20 minutes, about 30 minutes or about 60 minutes.

After completion of the heating step, and once a desired degree of conversion of the metal precursor (and nucleating agent) has been achieved, the solution preferably is cooled, preferably to about room temperature. Ideally, the cooling occurs in a quenching step in which the solution is cooled at a rate greater than about 5° C./min, e.g., greater than about 10° C./min, greater than about 30° C./min, or greater than about 50° C./min. In terms of ranges, the cooling step preferably comprises cooling the solution at a rate from about 5 to about 50° C./min, e.g., from about 5 to about 30° C./min. The cooling may be achieved in a variety of ways, e.g., by placing the solution in an ice bath, or by simply removing the heat source.

One of skill in the art will understand that the processes of the present invention can be carried out batch-wise, and also semi-continuously or continuously.

Preferably after the cooling of the reaction mixture to room temperature the formed nanoparticles may be separated from the liquid phase of the reaction mixture. This can be accomplished, for example, in the various ways of separating a solid from a liquid that are known to those of skill in the art. Non-limiting examples of suitable separation methods include filtration, centrifugation, chromatographic methods, electrophoretic techniques, etc. Because the nanoparticles have a very small mass, do not substantially agglomerate and have dispersing agent thereon that will usually interact with the components of the liquid phase, the nanoparticles will often not settle, i.e., separate from the liquid phase by themselves, at least not to a sufficient extent and/or within a desirably short period of time. A preferred method of achieving a separation of the nanoparticles from the liquid phase of the reaction mixture comprises the addition of one or more nanoparticle-precipitating substances to the reaction mixture. The suitability of a substance for causing a precipitation of the nanoparticles will usually depend, inter alia, on the nature of the dispersing agent. A non-limiting example of a nanoparticle-precipitating substance includes a substance that interferes with the (electronic and/or steric) interaction between the dispersing agent that is adsorbed on the surface of the nanoparticles and one or more components of the liquid phase. A preferred example of such a nanoparticle-precipitating substance is a solvent in which the dispersing agent is substantially insoluble or at least only poorly soluble. The nanoparticle-precipitating substance is preferably substantially soluble in and/or miscible with the liquid phase of the reaction mixture, in particular, the polyol(s). Often this substance will comprise an aprotic solvent, preferably a polar aprotic solvent. The term "aprotic" characterizes a solvent that is not capable of releasing (dissociating into) protons. Non-limiting examples of such solvents include ethers (e.g., diethyl ether, tetrahydrofuran, tetrahydropyran, etc.), sulfonyl compounds and particularly, carbonyl compounds such as, e.g., ketones, esters and amides, especially ketones. Preferred ketones comprise from 3 to about 8 carbon atoms such as, e.g., acetone, butanone, the pentanones, the hexanones, cyclopentanone and cyclohexanone. Of course, mixtures of aprotic solvents may be used as well. In a preferred embodiment, for example, a mixture of acetone and methanol is used to facilitate precipitation of the product particles.

The nanoparticle-precipitating substance(s) will usually be employed in an amount which is sufficient to cause a precipitation of at least a substantial portion of the nanoparticles that are present in the reaction mixture, e.g., at least about 90%, at least about 95%, or at least about 98% of the nanoparticles.

While the addition of a nanoparticle-precipitating substance in a sufficient quantity may result in a precipitation, the precipitation will frequently be unsatisfactory, particularly in cases where the volume of the liquid phase of the reaction mixture is substantial (e.g., at least about 1 liter, at least about 2 liters, or at least about 3 liters) and/or the concentration of the dispersing agent and/or the nanoparticles in the liquid phase is relatively high. For example, the addition of the nanoparticle-precipitating substance in a sufficient quantity to cause a precipitation of substantially all of the nanoparticles may frequently cause a concomitant precipitation of at least a substantial portion of the excess (unbound) dispersing agent that is present in the reaction mixture. The precipitated dispersing agent may form an oil which prevents or at least significantly interferes with (slows down) a settling of the nanoparticles, thereby making the separation of the nanoparticles from the liquid phase difficult, if not impossible.

It has been found that the required settling times can be shortened and/or the formation of oily precipitates can be significantly reduced or completely eliminated if before and/or during and/or after the addition of the nanoparticle-precipitating substance a protic solvent is added to the reaction mixture. The term "protic" characterizes a solvent that is capable of releasing (dissociating into) protons. Preferably, the protic solvent comprises a hydroxyl-containing compound, in particular, an alcohol such as, e.g., ethanol, propanol, butanol and the like, and/or a polyol, e.g., any of the polyols that may be used as a reactant in the process of the present invention. Water may also be used as the (or a part of the) protic solvent. Preferably, the protic solvent is or comprises one or more of the polyols that are present in the reaction mixture. Details regarding the addition of the protic solvent may be taken from U.S. patent application Ser. No. 11/331,238 entitled "Separation of Metal Nanoparticles," the entire disclosure of which is incorporated herein by reference.

According to a preferred aspect of the processes of the present invention, the precipitated nanoparticles are isolated by removing the liquid phase of the reaction mixture therefrom. Any process that is suitable for removing a liquid from a solid can be used for this purpose. Non-limiting examples of such a process include decantation, filtration, centrifugation and any combinations thereof. Preferably, the nanoparticles are isolated by centrifugation (including, for example, continuous centrifugation), filtration (including ultrafiltration, diafiltration etc.) or a combination of two or more of these processes.

With respect to continuous centrifugation, this can be accomplished in different ways. For example, one may use a unit (centrifuge) which is optimized for affording at least three different products in different sections of the unit, for example, a supernatant in a top section, undesirably large particles in a bottom section and desired product (e.g., nanoparticles in the desired particle size range) in a middle section. Each of these three products may be withdrawn continuously from the centrifuge while a fresh mixture for separation is continuously introduced into the centrifuge. According to another alternative of the continuous centrifugation, two or more centrifuges may be arranged in series, each of them being optimized for the removal of one kind of separation product, e.g., supernatant, undersized particles, particles in the desired particle size range, oversized particles, etc.

Regarding the ultrafiltration/diafiltration of nanoparticles reference may be made, for example, to U.S. Pat. Nos. 6,328,894, 5,879,715, 6,245,494 and 6,811,885, the entire disclosures of which are incorporated herein by reference. Briefly, ultrafiltration and diafiltration use a filtration under pressure through a membrane which allows only components of a certain maximum size to pass therethrough. In the present case, the metal nanoparticles will be retained by the membrane while preferably a major part or substantially all of the contaminants (e.g., dissolved inorganic matter, excess dispersing agent, etc.) and the like will be able to pass through the membrane. Any size of membrane as well as any channel (pore) size thereof can be used as long as the process permits a preferably substantial removal of contaminants and the like while retaining substantially all of the nanoparticles. In a preferred aspect, the membrane may vibrate to substantially reduce clogging and/or to permit a higher permeate flow rate. Also, the ultrafiltration/diafiltration may be pressure-driven (i.e., involving pressing through the membrane) or vacuum-driven (i.e., involving sucking through the membrane). Membrane configurations include, but are not limited to, flat sheet membranes, cross flow membranes, spiral wound tubes, or hollow fiber tubes. For example, a three compartment through-flow cell comprising two membranes may be used. Non-limiting examples of membrane materials include polymeric and ceramic materials such as, e.g., polysulfone, polyethersulfone, sulfonated polysulfone, polyamide, cellulose ester (e.g., cellulose acetate), and metal oxides such as the oxides of titanium, zirconium, silicon, aluminum and combinations of two or more thereof. By way of non-limiting example, the membrane may have a molecular weight cutoff (MWCO) in the range of from about 10,000 to about 1,000,000, e.g., about 50,000, about 100,000, about 200,000 or about 500,000, and/or a pore size of from about 0.01 µm to about 1 µm (preferably at least about 0.02 µm and not higher than about 0.5 µm) and/or a lumen of from about 0.1 mm to about 5 mm (preferably at least about 2 mm and not more than about 3 mm).

Any type of ultrafiltration/diafiltration process may be used as long as the process is capable of removing a substantial portion of the contaminants and the like (e.g., at least about 70%, at least about 80%, at least about 90%, or at least about 95%) and in particular, that part of the dispersing agent that is not adsorbed on the surface of the nanoparticles while retaining substantially all of the nanoparticles. By way of non-limiting example, a cross-flow separation process may be used.

The nanoparticles that have been separated from the liquid phase are preferably subjected to a washing operation to remove at least a substantial portion of the impurities that may still be associated therewith such as, e.g., materials that are not adsorbed on the surface of the nanoparticles to any significant extent. For example, these impurities may include inorganic salts formed during the reduction of the metal precursor and/or the nucleate precursor, residual solvent(s) from the precipitation step and excess dispersing agent, i.e., dispersing agent that is merely present as an impurity without being adsorbed on the nanoparticles. The washing liquid used for the washing operation preferably is or comprises a solvent that is capable of dissolving the impurities associated with the nanoparticles, in particular, excess dispersing agent. By way of non-limiting example, the washing liquid may comprise water and/or an organic solvent, for example, a polar organic solvent. One of skill in the art will appreciate that the most desirable washing liquid(s) for a specific case will to a large extent depend on the nature of the impurities to be removed, e.g., polar vs. a polar, inorganic vs. organic, etc. In some cases it may be advantageous to use two or more different washing liquids (preferably successively or with a concentration gradient) for obtaining the best results. Non-limiting examples of a washing liquids include liquids which comprise or consist of water and/or one or more protic organic solvents such as, e.g., a hydroxyl-containing compound, preferably, an alcohol and/or a polyol. Illustrative and non-limiting examples of alcohols and polyols that may be used for the washing operation include aliphatic alcohols having from 1 to about 12 carbon atoms such as, e.g., methanol, ethanol, propanol, isopropanol, butanol, pentanol, cyclopentanol, hexanol, cyclohexanol, octanol, decanol, dodecanol and the like, and polyols having from 1 to about 4 hydroxyl groups and from 2 to about 12 carbon atoms such as, e.g., ethylene glycol, propylene glycol, glycerol and the like. A preferred solvent for use in the washing operation includes ethanol, which may be used alone or in combination with other solvents (e.g., water). Of course, non-protic solvents may also be useful for the washing operation. Non-limiting examples thereof include ketones such as, e.g., acetone and butanone, ethers such as, e.g., diethylether and tetrahydrofuran, esters such as, e.g., ethyl acetate, amides such as, e.g., dimethylformamide and dimethylacetamide, sulfoxides such as, e.g., dimethyl sulfoxide, and optionally halogenated hydrocarbons such as, e.g., hexane, cyclohexane, heptane, octane, petrol ether, methylene chloride, chloroform, toluene, the xylenes, etc. Combinations of two or more of these solvents may, of course, also be used.

The washing operation may, for example, be carried out by dispersing the isolated crude nanoparticles obtained after, e.g., a filtration (including, e.g., a diafiltration/ultrafiltration) and/or centrifugation of the reaction mixture in a washing liquid, followed by a separation of the particles from the washing liquid by, e.g., filtration and/or centrifugation. This process may optionally be repeated one or more times. The washed (purified) nanoparticles may thereafter be dried (e.g., under reduced pressure and/or at a temperature that does not adversely affect the dispersing agent to any significant extent) and thereafter stored and/or shipped. For safety reasons, however, some nanoparticulates formed by the processes of the present invention, such as nickel-containing nanoparticles, are not fully dried. Even after storage for extended periods the dry particles can be redispersed in a desired liquid to form a dispersion (e.g., a printing ink) that is substantially stable over several days or even weeks (for example, wherein not more than about 20%, e.g., not more than about 10%, or not more than about 5% of the nanoparticles have settled after storing the dispersion at room temperature for at least one day, e.g., at least two days, or at least one week).

In a preferred aspect of the present invention, the further processing of the nanoparticle containing reaction mixture obtained after carrying out the reduction of the metal precursor and nucleate precursor may be carried out by using substantially only ultrafiltration/diafiltration. In particular, the use of ultrafiltration/diafiltration makes it possible to dispense with the addition of a nanoparticle-precipitating substance to the reaction mixture and even allows combining the separation and washing operations of the nanoparticles in a single operation. Further, at least the last liquid that is added to the nanoparticles before the ultrafiltration/diafiltration thereof is completed may be selected to be the vehicle of a desired dispersion of the nanoparticles (for example, of a printing ink) or a component thereof, thereby making it possible to convert the nanoparticle containing reaction mixture into the desired nanoparticle containing product in a single unit/operation. Also, one or more additives may be incorporated in the washing liquid and/or the liquid that is intended to be the vehicle of the desired dispersion or a component thereof. For example, in order to keep the dissolution of adsorbed dispersing agent at a minimum it may be advantageous to add some dispersing agent to, e.g., the washing liquid. Also, one or more additives whose presence may be desirable in the final nanoparticle containing product (e.g., a printing ink) may be incorporated into the liquid used in the final step(s) of a diafiltration operation (such as, e.g., adhesion promoters, humectants, etc.).

By way of non-limiting example, the diafiltration/ultrafiltration may be carried out by placing the nanoparticle containing reaction mixture in a diafiltration unit and concentrating the reaction mixture therein to a predetermined fraction of the original volume by pressing (application of pressure) or drawing (application of vacuum) the reaction mixture through one or more ultrafiltration membranes of suitable MWCO/pore size. Thereafter, a first liquid that is capable of dissolving impurities and contaminants present in the reaction mixture (in particular, excess dispersing agent) may be added to the concentrated reaction mixture (e.g., in an amount sufficient to restore the originally employed volume of the reaction mixture) and the resulting mixture may be concentrated in the same way as the originally employed reaction mixture. A second liquid which is capable of dissolving impurities and contaminants and which may be the same as or different from the first liquid may be added to the resulting concentrate and the resulting mixture may be concentrated again. This process may be repeated as often as necessary with a third, fourth, etc., liquid. Alternatively, before concentrating the original reaction mixture a predetermined amount of the first liquid may be added thereto and the resulting mixture may be concentrated, e.g., until the original volume of the reaction mixture is reached again. Then the second liquid may be added and a second concentration operation may be carried out, etc. Of course, any combination of the two alternatives described above may be used as well. For example, the original reaction mixture may be concentrated first and then the first liquid may be added in an amount which results in a volume of the resultant mixture which exceeds the volume of the original reaction mixture, whereafter the resultant mixture may be concentrated to the volume of the original reaction mixture, whereafter a second liquid may be added, etc. At the end of each of these alternative ways of isolating/purifying the metal nanoparticles by ultrafiltration/diafiltration the liquid may be removed partially or completely by ultrafiltration, leaving behind the purified substantially non-agglomerated metal nanoparticles with the dispersing agent thereon, or a concentrated and stable dispersion thereof. The nanoparticles may then optionally be dried to form a powder batch of dry nanoparticles. Alternatively, the liquids that are used for the diafiltration operation may be selected such that at least at the end of the diafiltration operation the purified nanoparticles are combined with a liquid which is the vehicle or at least a part of the vehicle of a desired dispersion of the metal nanoparticles (e.g., a printing ink). The liquids which may be used for carrying out the diafiltration/ultrafiltration include those which have been mentioned above in the context of the separation of the nanoparticles from the liquid phase and the washing of the separated nanoparticles.

It is to be appreciated that the use of ultrafiltration/diafiltration is advantageous not only for the separation and/or purification of metal nanoparticles that have been produced by the process of the present invention but is a procedure which is of general applicability for separating inorganic nanoparticles and, in particular, metal nanoparticles that have a polymeric substance (e.g., an anti-agglomeration substance as used in the process of the present invention) adsorbed on their surface from a liquid which comprises a dissolved polymeric substance (either the same as or different from the adsorbed polymeric substance) and for purifying (e.g., washing) such nanoparticles and for formulating such separated/purified nanoparticles into a desired product (e.g., a dispersion).

Nanoparticles

The processes of the present invention provide the ability to form novel nanoparticles from metal precursors having low reduction potentials. As a result, in another aspect, the invention is to a nanoparticle or a plurality of nanoparticles, e.g., as a powder or dispersed as an ink. As indicated above, the processes involve the conversion of a nucleate precursor to a nucleate and a metal precursor to its corresponding metal, preferably on a surface of the nucleate. The nanoparticles formed by these processes typically have a core formed substantially from the nucleate and a metal layer (formed from the metal precursor) on a surface of the core. In a preferred embodiment, the invention is to a nanoparticle, comprising: (a) a core having a largest dimension less than about 50 nm; and (b) a metal layer at least partially, but preferably substantially, surrounding the core and having a largest dimension less than about 300 nm.

In this aspect, the core preferably has a largest dimension less than about 40 nm, less than about 30 nm, less than about 20 nm, less than about 10 nm, less than about 8 nm, less than about 5 nm, or less than about 3 nm. In terms of lower range limits, optionally in combination with the above-presented upper range limits, the core optionally has a largest dimension greater than about 1 nm, greater than about 3 nm, greater than about 5 nm, greater than about 10 nm, greater than about 15 nm or greater than about 20 nm.

The metal layer of the nanoparticle or nanoparticles preferably has a largest dimension less than about 200 nm, less than about 100 nm, less than about 75 nm, less than about 60 nm, or less than about 50 nm. In terms of lower range limits, optionally in combination with the above-described upper range limits, the metal layer preferably has a largest dimension greater than about 10 nm, greater than about 25 nm, greater than about 50 nm or greater than about 75 nm.

In this aspect of the invention, the metal layer preferably comprises a metal having a cationic form with a reduction potential less than about 0.6 V, e.g., less than about 0.3 V, or less than about 0 V. In several preferred embodiments, the metal layer comprises a metal selected from the group consisting of: nickel, copper, cobalt, iron, and chromium. The core optionally comprises a metal selected from the group consisting of: silver, copper, platinum, palladium and gold or an oxide selected from the group consisting of silica, titania, alumina and zirconia or metal alloy selected from Ag/Pt, Ag/Pd, Ag/Au.

It is to be understood that depending on the relative reactivities of the nucleating agent and the metal precursor, there may be: (1) a sharp separation between the core and the metal layer disposed on the core; or (2) a gradual separation between the core and the metal layer disposed on the core. A sharp separation will be seen if the nucleating agent is significantly more reactive (significantly more easily reducible) than the metal precursor. Conversely, nanoparticles having a more gradual separation between the core and the metal layer phases will be formed from nucleate precursors that are only slightly more reactive (slightly more easily reducible) than the metal precursor.

In a preferred embodiment, the nanoparticle or population of nanoparticles further comprises a dispersing agent disposed on at least a portion of the surface of the metal layer. Thus, the metal layer has a surface and the nanoparticle optionally further comprises a dispersing agent disposed on at least a portion of the surface of the metal layer. The dispersing agent may be selected from any of the dispersing agents described above, but preferably comprises PVP.

Depending, among other things, on the amount of anti-agglomeration present in the nanoparticles, the nanoparticle (or plurality of nanoparticles) may be in the form of a non-agglomerated primary particle, or, alternatively, as an agglomerate of primary nanoparticles. In this context, the term "primary nanoparticles" refers to identifiable particulate domains that are either substantially unagglomerated (i.e., substantially unattached to each other) or if agglomerated nevertheless retain the identifiable particulate attributes, in that the particulate domains are joined together through an interaction between the still identifiable separate particulate domains. In a preferred embodiment, the nanoparticle is (a) part of an agglomerate of nanoparticles, the agglomerate having a particle size of from about 200 nm to about 5 μm, e.g., from about 500 nm to about 4 μm or from about 1 μm to about 3 μm.

In another embodiment, the invention is to a powder comprising a plurality of the nanoparticles, as described above. The ink optionally is dispersable in a liquid vehicle. Thus, in another embodiment, the invention is to an ink comprising a plurality of the nanoparticles and a liquid vehicle. In this aspect, the liquid vehicle acts to disperse the metallic nanoparticles. The dispersed nanoparticle advantageously may be printed onto a substrate. For example, the ink may be printed through a direct write printing process, e.g., ink jet printing, or through any other printing process, e.g., intaglio printing, lithographic printing, or gravure printing. Such printing processes may be used, for example: (1) to form printable electronic features, e.g., conductive features, resistors, dielectric features, etc.; (2) to form a catalytic layer or electrode in an electronic cell (e.g., battery or fuel cell); and/or (3) to form a security feature, as described, for example, in U.S. patent application Ser. No. 11/331,233, filed Jan. 13, 2006, the entirety of which is incorporated herein by reference. Thus, in various other embodiments, the invention is to an electrically conductive feature, a catalytic layer, a solderable layer, a diffusion barrier layer or electrode of a fuel cell, or a security feature comprising the nanoparticles of the present invention.

With the processes of the present invention, it is possible to control the size, the size distribution and/or the shape of the nanoparticles even on a large scale. For example, particles that exhibit a high degree of uniformity in size and/or shape may be produced by the process of the present invention. For example, the processes of the present invention are capable of affording particles with a substantially spherical shape or quasi-spherical in shape. In one aspect of the present invention, at least about 90%, e.g., at least about 95% of the nanoparticles formed by the process of the present invention may be of a substantially spherical shape. In another aspect, the particles may be substantially free of micron-size particles (i.e., particles having a size of about 1 μm or above). Even more preferably, the nanoparticles may be substantially free of particles having a size (=largest dimension, e.g., diameter in the case of substantially spherical particles) of more than about 500 nm, e.g., of more than about 200 nm, or of more than about 100 nm. In this regard, it is to be understood that whenever the size and/or dimensions of the nanoparticles are referred to herein and in the appended claims, this size and these dimensions refer to the nanoparticles without dispersing agent thereon, i.e., nanoparticles formed from the nucleate precursor and the metal precursor. Depending on the type and amount of dispersing agent, an entire nanoparticle, i.e., a nanoparticle which has the dispersing agent thereon, may be significantly larger than the portion formed from the nucleate precursor and metal precursor. Also, the term "nanoparticle" as used herein and in the appended claims encompasses particles having a size/largest dimension of the metallic portion of up to about 900 nm, preferably of up to about 500 nm. By way of non-limiting example, not more than about 5%, e.g., not more than about 2%, not more than about 1%, or not more than about 0.5% of the particles that are formed by the process of the present invention may be particles whose largest dimension (e.g., diameter) is larger than about 200 nm, e.g., larger than about 150 nm, or larger than about 100 nm. In a particularly preferred aspect, at least about 95% of the nanoparticles may have a size of not larger than about 80 nm and/or at least about 80% of the nanoparticles may have a size of from about 30 nm to about 70 nm.

In another aspect, the nanoparticles formed by the processes of the present invention may have an average particle size (expressed as number average) of at least about 10 nm, e.g., at least about 30 nm, or at least about 50 nm, but preferably not higher than about 300 nm, e.g., not higher than about 250 nm, or not higher than about 200 nm. The average particle sizes and particle size distributions referred to herein may be measured by conventional methods such as, e.g., by scanning electron microscopy (SEM) or tunneling electron microscopy (TEM) and refer to the metallic portion of the nanoparticles.

In yet another aspect of the process of the present invention, at least about 80 volume percent, e.g., at least about 90 volume percent of the nanoparticles formed by the processes of the present invention may be not larger than about 2 times, e.g., not larger than about 1.5 times the average particle size (volume average).

The reduction processes of the present invention and the optional further processing of the reaction mixture obtained thereby are capable of affording large, commercially useful quantities of substantially non-agglomerated, dispersed or redispersable metal nanoparticles in a single run. For example, in batch-wise operation the process of the present invention can be carried out on a scale at which at least about 30 g, e.g., at least about 40 g, at least about 50 g, or at least about 60 g of substantially non-agglomerated, dispersed or redispersable metal (e.g., silver) nanoparticles (expressed as pure metal without dispersing agent) are produced in a single run. In a preferred aspect, a single run will afford at least about 100 g, at least about 200 g, or at least about 500 g of substantially non-agglomerated, dispersed or redispersable metal nanoparticles.

Further, in one aspect of the present invention a concentrated batch of metal nanoparticles—a so-called "masterbatch"—may be produced which may be a liquid or solid at room temperature and comprises a high concentration of metal nanoparticles and may be stored for an extended period of time and subsequently redispersed by adding solvents and/or diluents. By way of non-limiting example, the masterbatch may comprise dispersing agent and metal nanoparticles alone, or the masterbatch may comprise metal nanoparticles, dispersing agent and solvents/diluents. In another embodiment of this invention, a concentrated metal nanoparticle batch may be further concentrated by removing the solvent to produce a batch of dry metal nanoparticles comprised primarily of metal nanoparticles and dispersing agent, which batch can be substantially completely redispersed to form a stable dispersion (e.g., a desired printing ink) on adding a suitable solvent or diluent liquid. Due to, for example, the reduced volume thereof, a dry masterbatch is particularly advantageous for shipping and storage over an extended period of time. In this regard, it is to be appreciated that the dispersing agent on the surface of the metal nanoparticles will usually not only substantially prevent an (irreversible) agglomeration of the nanoparticles, but also increase the shelf life of the nanoparticles and in particular, of dry nanoparticles by shielding to at least some extent the surfaces of the metal cores of these nanoparticles from an attack by oxygen (oxidation), heat, harmful radiation (e.g., UV rays) and the like.

EXAMPLES

The present invention will be further illustrated by the following non-limiting examples.

Example 1 Ag Nucleated Ni Nanoparticles 5.2 g of Ni-acetate tetrahydrate was completely dissolved in 100 g of propylene glycol at 60° C. and the solution was cooled down to room temperature. 0.2 g of silver nitrate in ethylene glycol solution (8.5 wt %) was added into the transparent green precursor solution at the room temperature while stirring vigorously. 30 g of sodium hydroxide/water solution (1 M) was also added next under the same condition. Then the reaction temperature was set to 180° C. The solution was kept boiling until water and volatile organics were distilled off. PVP in propylene glycol solution was added at 1600. The reaction was boiled until the solution color turned black and kept heating at the reaction temperature for 1 hour after the color change. The final product was precipitated by adding acetone and separated from the solution by centrifugation. The precipitate was washed several times with ethanol and water.

Figure 2:
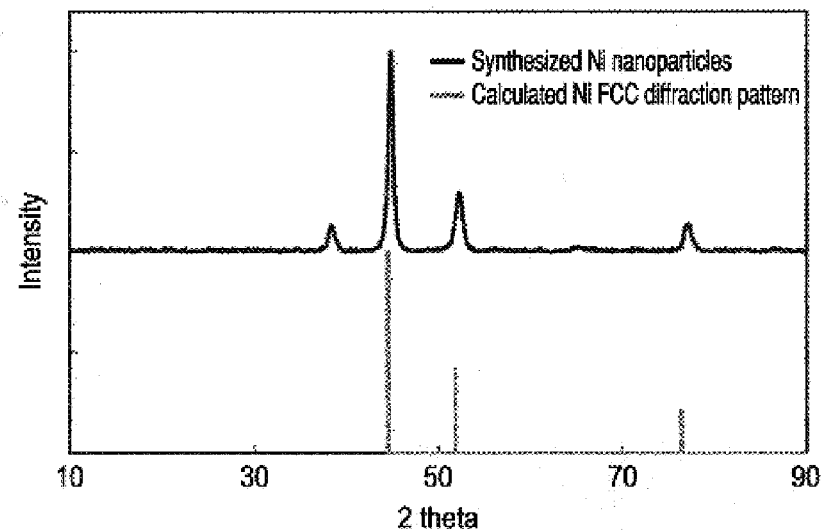
FIG. 2 presents an X-Ray Diffraction (XRD) analysis of nickel nanoparticles formed in Example 1.
Figure 3:
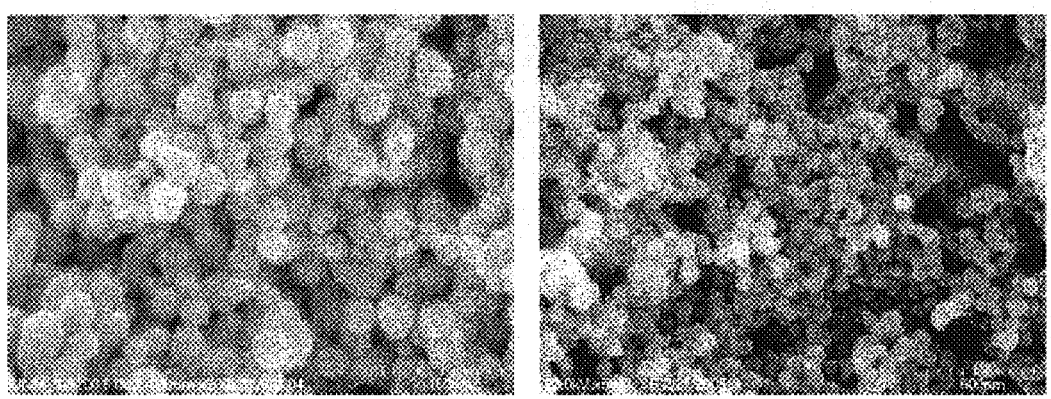
FIG. 3 presents an scanning electron micrograph (SEM) of the nickel nanoparticles formed in Example 1.

In order to confirm Ni FCC phase formation, X-ray powder diffraction (XRD) and Scanning electron microscopy analysis (SEM) were performed on the dried Ni nanoparticles and the following FIGS. 2 and 3 show their results. FIG. 2 shows an XRD plot showing peaks indicating the formation of nickel nanoparticles. FIG. 3 shows SEM images of the nickel nanoparticles showing their uniform spherical structure.

Example 2 Pd Nucleated Ni Nanoparticles 5.1 g of Ni-acetate tetrahydrate was completely dissolved in 100 g of propylene glycol at 60° C. and the solution was cooled down to room temperature. 15 g of sodium hydroxide/water solution (1 M) was added into the transparent green precursor solution at the room temperature while stirring vigorously. Then the reaction temperature was set to 180° C. The solution was kept boiling until water and volatile organics were distilled off. PVP in propylene glycol solution was added at 160°. 11.3 g of Pd-acetate solution in dichloromethane (4.2 wt %) was added slowly into the reaction solution. The reaction was boiled until the solution color turned black and kept heated at the reaction temperature for 1 hour after the color change. The final product was precipitated by addition acetone and separated from the solution by centrifugation. The precipitates were washed several times with ethanol and water.

Figure 4:
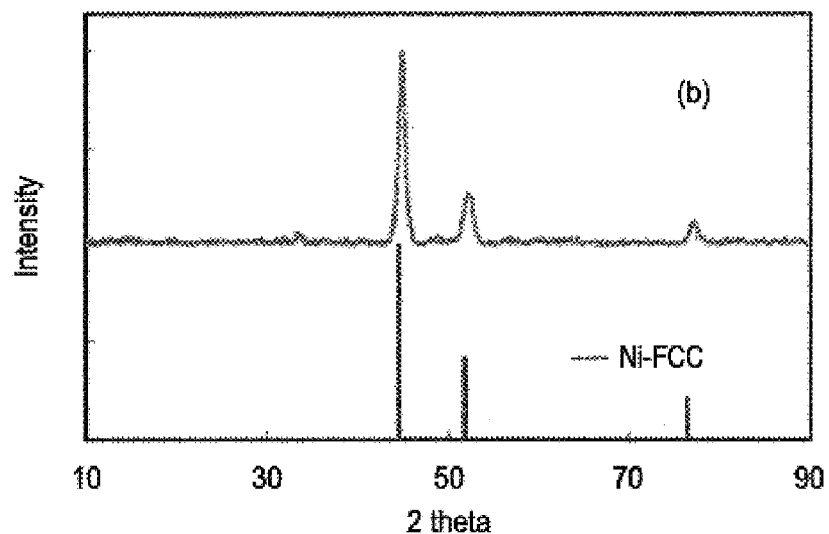
FIG. 4 presents an XRD analysis of nickel nanoparticles formed in Example 2.
Figure 5:
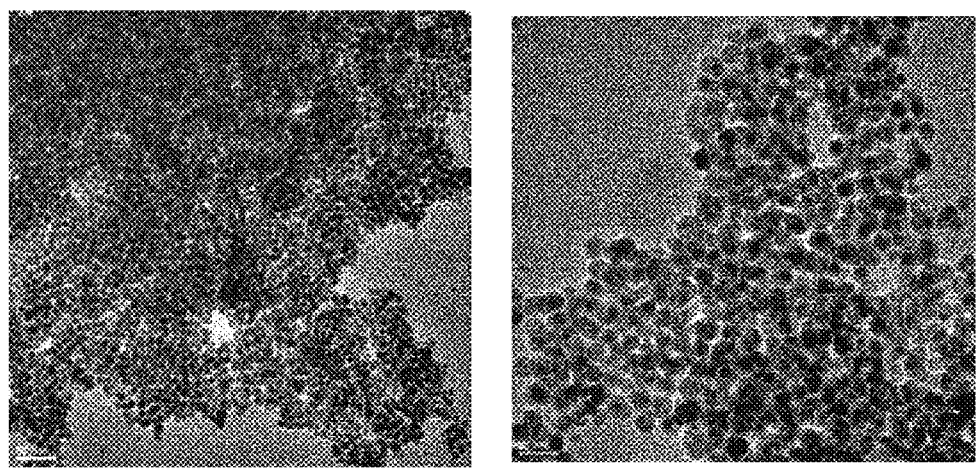
FIG. 5 presents an transmission electron micrograph (TEM) of the nickel nanoparticles formed in Example 2.

In order to confirm Ni FCC phase formation, X-ray powder diffraction (XRD) and transmission electron microscopy analysis (TEM) were performed on the dried Ni nanoparticles and the following FIGS. 4 and 5 show their results. FIG. 4 shows an XRD plot showing peaks indicating the formation of nickel nanoparticles. FIG. 5 shows TEM images of the nickel nanoparticles showing their uniform spherical structure.

It is noted that the foregoing examples have been provided merely for the purpose of explanation and are in no way to be construed as limiting of the present invention. While the present invention has been described with reference to an exemplary embodiment, it is understood that the words that have been used are words of description and illustration, rather than words of limitation. Changes may be made, within the purview of the appended claims, as presently stated and as amended, without departing from the scope and spirit of the present invention in its aspects. Although the invention has been described herein with reference to particular means, materials and embodiments, the invention is not intended to be limited to the particulars disclosed herein. Instead, the invention extends to all functionally equivalent structures, methods and uses, such as are within the scope of the appended claims.

What is claimed is:

1. A nanoparticle, comprising:
   (a) a core comprising a material selected from the group consisting of silver, copper, platinum, gold, a Ag/Pt alloy, and a Ag/Au alloy and having a largest dimension less than about 10 nm; and
   (b) a metal layer substantially surrounding the core and having a largest dimension less than about 200 nm, wherein the metal layer comprises a metal having a cationic form with a reduction potential less than about 0.6 V and wherein the metal layer is formed on the core by reducing a metal precursor in the presence of a base.

2. The nanoparticle of claim 1, wherein the metal has a cationic form with a reduction potential less than about 0.3 V.

3. The nanoparticle of claim 1, wherein the metal has a cationic form with a reduction potential less than about 0 V.

4. The nanoparticle of claim 1, wherein the metal layer comprises a metal selected from the group consisting of: nickel, copper, cobalt, iron, and chromium.

5. The nanoparticle of claim 1, wherein the metal layer has a surface and the nanoparticle further comprises a dispersing agent disposed on at least a portion of the surface of the metal layer.

6. The nanoparticle of claim 5, wherein the dispersing agent comprises PVP.

7. The nanoparticle of claim 1, wherein the nanoparticle is part of an aggregate of nanoparticles, the aggregate having a particle size of from about 1 μm to about 5 μm.

8. The nanoparticle of claim 1, wherein the metal layer comprises an alloy.

9. The nanoparticle of claim 1, wherein the nanoparticles are quasi-spherical.

10. A powder comprising a plurality of the nanoparticles of claim 1.

11. An ink comprising a plurality of the nanoparticles of claim 1 and a liquid vehicle.

12. A nanoparticle comprising:
   (a) a core comprising a material selected from the group consisting of silver, copper, platinum, gold, a Ag/Pt alloy, and a Ag/Au alloy and having a largest dimension less than about 10 nm; and
   (b) a metal layer substantially surrounding the core and having a largest dimension less than about 200 nm, wherein the metal layer comprises a metal selected from the group consisting of: nickel, copper, cobalt, iron and chromium, and wherein the metal layer is formed on the core by reducing a metal precursor in the presence of a base.

* * * * *